United States Patent [19]
Char et al.

[11] Patent Number: 5,696,392
[45] Date of Patent: Dec. 9, 1997

[54] BARRIER LAYERS FOR OXIDE SUPERCONDUCTOR DEVICES AND CIRCUITS

[75] Inventors: Kookrin Char, Palo Alto; Theodore H. Geballe, Woodside; Brian H. Moeckly, Palo Alto, all of Calif.

[73] Assignee: Conductus, Inc., Sunnyvale, Calif.

[21] Appl. No.: 345,318

[22] Filed: Nov. 28, 1994

Related U.S. Application Data

[63] Continuation-in-part of Ser. No. 106,334, Aug. 12, 1993, abandoned, which is a continuation-in-part of Ser. No. 944,643, Sep. 14, 1992, abandoned.

[51] Int. Cl.$^6$ .................. H01L 39/12; H01L 39/22
[52] U.S. Cl. .................. 257/190; 257/31; 257/33; 257/35; 505/238; 505/329; 505/702; 505/781
[58] Field of Search .................. 257/31, 32, 33, 257/34, 35, 36, 37, 38, 39; 505/190, 238, 329, 702, 781

[56] References Cited

U.S. PATENT DOCUMENTS

| | | | |
|---|---|---|---|
| 4,814,107 | 3/1989 | Steinberg | 252/520 |
| 5,077,270 | 12/1991 | Takeda et al. | 505/1 |
| 5,087,605 | 2/1992 | Hegde et al. | 257/33 |
| 5,162,294 | 11/1992 | Talvacchio et al. | 505/1 |
| 5,217,945 | 6/1993 | Wada et al. | 505/1 |
| 5,241,191 | 8/1993 | Agostinelli et al. | 257/33 |

OTHER PUBLICATIONS

Char et al., "Extension of the Bi–Epitaxial Josephson Junction Process to Various Substrates", Applied Physics Letters, vol. 59, No. 17, Oct. 21, 1991, pp. 2177–2179.

Hunt et al., "All High Tc Edge–Geometry Weak Links Utilizing Y–Ba–Cu–O Barrier Layers," Applied Physics Letters, vol. 59, No. 8, Aug. 19, 1991, pp. 982–984.

Gray, "Strontium Ceramics for Chemical Applications", Journal of Power Sources, vol. 6, 1991, pp.121–142.

Tamegi et al., "Universal Transport Anomaly in $YBa_2Cu_3O_7$–Type Systems with Reduced Carrier Density," Physical Review B, vol. 44, No. 18, Nov. 1, 1991, pp. 10167–10172.

Polturak, E. et al., "Proximity effect in $YBa_2Cu_3O_7/Y_{0.6}Pr_{0.4}Ba_2Cu_3O_7$ junctions," Phys.Rev. Lett. vol. 67, No. 21, 18 Nov. 1991, pp.3038–3041.

(List continued on next page.)

*Primary Examiner*—Mahshid D. Saadat
*Assistant Examiner*—Alice W. Tang
*Attorney, Agent, or Firm*—Judith A. DeFranco, Esq.

[57] ABSTRACT

A conductor suitable for use in oxide-based electronic devices and circuits is disclosed. Metallic oxides having the general composition $AMO_3$, where A is a rare or alkaline earth or an alloy of rare or alkaline earth elements, and M is a transition metal, exhibit metallic behavior and are compatible with high temperature ceramic processing. Other useful metallic oxides have compositions $(A_{1-x}A'_x)A''_2(M_{1-y}M'_y)_3O_{7-\delta}$ or $(A_{1-x}A'_x)_m(M_{1-y}M'_y)_nO_{2m+n}$, where $0 \leq x, y \leq 1$ and $0.5 \leq m, n \leq 3$, A and A' are rare or alkaline earths, or alloys of rare or alkaline earths, A' and A" are alkaline earth elements, alloys of alkaline earth elements, rare earth elements, alloys of rare earth elements, or alloys of alkaline earth and rare earth elements, and M and M' are transition metal elements or alloys of transition metal elements. The metallic oxides grow epitaxially on oxide superconductors as well as on substrates and buffer layers commonly used for growth of oxide superconductors. The oxide superconductors can also be grown epitaxially on these metallic oxides. Vastly improved performance of superconductor-normal-superconductor (SNS) junctions in high temperature superconductor materials are obtained when the normal material is a metallic oxide of the type disclosed. In the preferred embodiment, the conducting oxide $CaRuO_3$ is used as the normal material in an SNS junction with $YBa_2Cu_3O_{7-\delta}$ as superconductor. A dc superconducting quantum interference device (SQUID) functioning at 77K fabricated with this type of junction exhibits large modulation and low noise.

11 Claims, 11 Drawing Sheets

OTHER PUBLICATIONS

Tarutani, Y., et al., "Superconducting characteristics of a planar-type $HoBa_2Cu_3O_{7-x}$–$La_{1.5}Ba_{1.5}Cu_3O_7$–$HoBa_2Cu_3O_{7-x}$ junction," *Appl. Phys. Lett.* vol. 58, No. 23., 10 Jun. 1991, pp. 2707–2709.

A. Kanbayasi, "Magnetic Properties of $SrRuO_3$ Single Crystal," *J. Phys. Soc. of Japan*, vol. 41, No. 6, pp. 1876–1878, Dec. 1976.

T.C. Gibb, R. Greatrex, N.N. Greenwood, D.C. Puxley, K.G. Snowdon, "A Study of the Magnetic Superexchange Interactions in the Solid–Solution Series $Ca_xSr_{1-x}RuO_3$ by Ruthenium–99 Mössbauer Spectroscopy," *J. Sol. State Chem.*, vol. 11, pp1 17–25, 1974.

P.A. Cox, R.G. Egdell, J.B. Goodenough, A. Hamnett, C.C. Naish, "The metal–to–semiconductor transition in ternary ruthenium (IV) oxides: a study by electron spectroscopy," *Phys. C; Solid State Phys.*, vol. 16, pp. 6221–6239, 1983.

J.M. Longo, P.M. Raccah, J.B. Goodenough, "Magnetic Structures II: Magnetic Properties of $SrRuO_3$ and $CaRuO_3$," *J. Appl. Phys.*, vol. 39, No. 2, pp. 1327–1328, 01 Feb. 1968.

Mizuno et al., "Fabrication of Thin–Film–Type Josephson Junctions Using a Bi–Sr–Ca–Cu–O/Bi–Sr–Cu–O/ Bi–Sr–Ca–Cu–O Structure," *Appl. Phys. Lett.*, vol. 56, No. 15, Apr. 9, 1990, pp. 1469–1471.

Harada et al, "Heteroepitaxial Growth of Y–Ba–Cu–O/ Bi–Sr–Cu–O/Y–Ba–Cu–O," *Japanese J. Of Appl/ Phys*, vol. 29, No. 7, Jul. 1990, pp. L1114–L1116.

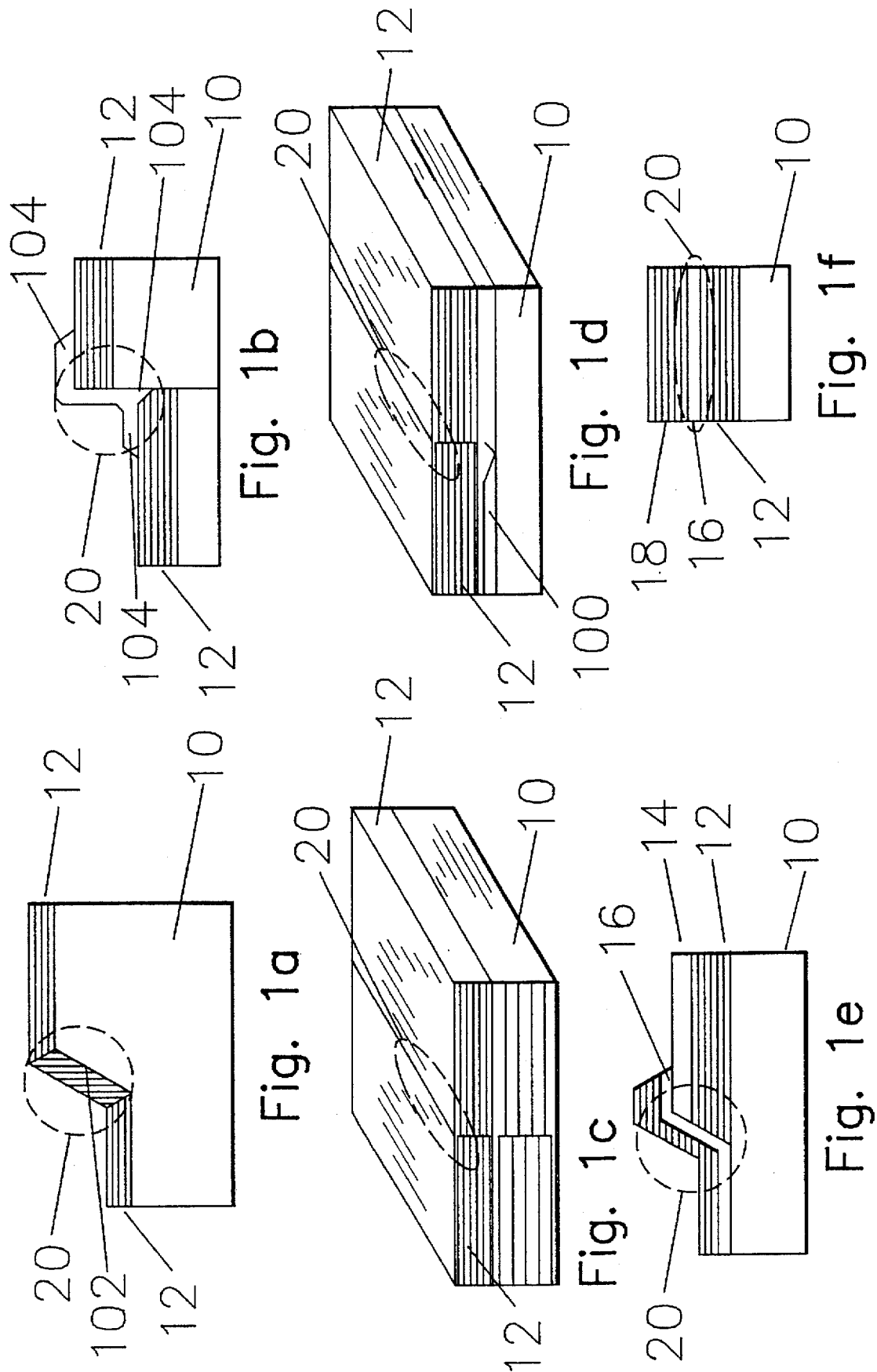

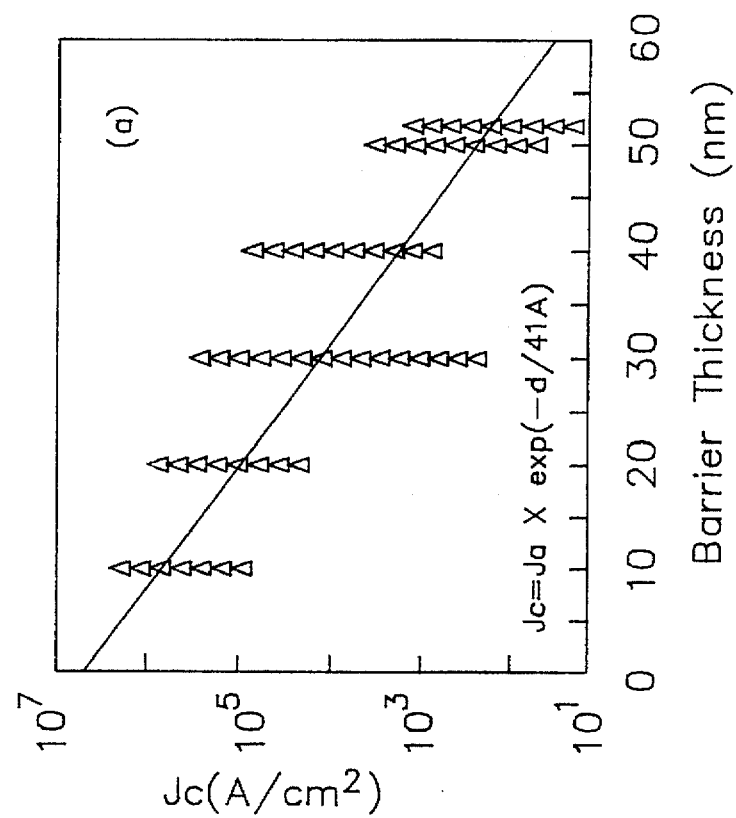
Fig. 5
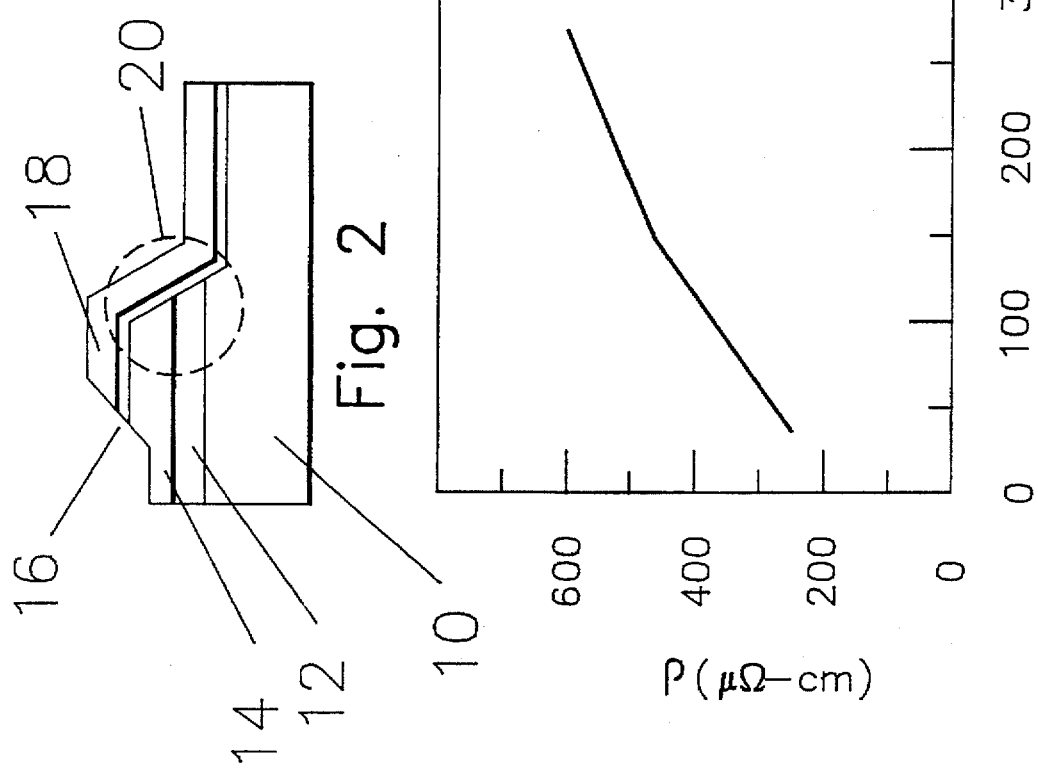
Fig. 2
Fig. 3

BARRIER LAYERS FOR OXIDE SUPERCONDUCTOR DEVICES AND CIRCUITS

CROSS-REFERENCE TO OTHER APPLICATIONS

This is a continuation-in-part of U.S. patent application Ser. No. 08/106,334 filed 12 Aug. 1993, now abandoned, which is a continuation-in-part of U.S. patent application Ser. No. 07/944,643 filed 14 Sep. 1992, now abandoned.

FIELD OF THE INVENTION

This invention relates to the use of metallic oxides in devices and circuits based on oxide superconductor components. More particularly, this invention relates to the use of a truly metallic oxide material as the normal metal in an SNS junction or in a metallization pattern in an integrated circuit. Here, the metallic oxide is either a simple perovskite having the general composition $AMO_3$, where A is a rare or alkaline earth element or alloy and M is a transition metal, or a layered perovskite such as heavily doped, or alloyed, $YBa_2Cu_3O_{7-\delta}$ (YBCO) or another cuprate superconductor.

BACKGROUND OF THE INVENTION

Since the 1986 discovery of the new class of oxide superconductors, also known as high temperature superconductors (HTS), cuprate superconductors, and perovskite superconductors, many attempts have been made to fabricate useful junctions, devices, circuits, and systems. This discovery promised to bring the many benefits of superconductors to electronic circuits at a practically attainable temperature. Achieving these benefits, however, has been less than straightforward due to the nature of the materials, which is quite different from the metals and semiconductors normally used in electronics applications.

The first obstacle, now largely overcome, was the polycrystalline nature of these new ceramic superconductors. Traditional low temperature superconductors, having a superconducting transition temperature $T_c<23K$, are metals, metal alloys, or intermetallic compounds. Metals are usually polycrystalline, but metallic bonding is so delocalized that the grain boundaries in these materials are not electrically active. Furthermore, coherence lengths in these superconductors are on the order of 100 nm, which is much larger than the size of a single grain, i.e., a single crystallite making up part of the polycrystalline body. This means that the superconducting electron pairs are affected by the average environment produced by many individual grains and so are not extremely sensitive to inhomogeneities at grain boundaries or other regions whose size is much less than a coherence length.

The cuprate superconductors are ceramic materials with ionic and covalent bonds which are more directional and localized than metallic bonds. Across grain boundaries atoms are displaced with respect to their normal positions in the ideal crystal. Chemical bonds between these displaced atoms are stretched, bent, broken, and sometimes vacant, depending on the atoms considered and their relative displaceracists in distance and angle from their ideal positions. This sort of disruption of the electronic structure of the material, much more severe with directional bonding than with isotropic metallic bonding, can cause corresponding disruptions in the transport properties of the material. It is for this reason that bulk polycrystalline specimens of the cuprate superconductors typically have critical current densities which are reduced by an order of magnitude or more when compared to well oriented epitaxial films of the same chemical composition.

Another exacerbating factor is the very small and anisotropic coherence of the superconducting perovskites. The coherence length in these materials has been estimated at about 1.5 nm in the a-b plane and about ten times less (0.15 nm) in the c-direction. These distances are much smaller than the dimensions of a typical grain, and are of the order of the lattice constant in the c-direction in $YBa_2Cu_3O_{7-\delta}$ ($0 \leq \delta \leq 0.5$). The result is that the electrical properties of these superconductors are strongly influenced by the microstructure as well as the local environment of defects, including impurity atoms, vacancies, voids, dislocations, stacking faults, and grain boundaries.

With such a small coherence length, virtually any deviation from perfection can interrupt the flow of supercurrent enough to form a junction. Early thin films were so full of grain boundary junctions, due to their poor in-plane epitaxy, that the inherent properties of the material were masked by the behavior of thousands of weak-link junctions occurring naturally in the polycrystalline layers. Now, however, the crystal growth technology has progressed to the current state in which high-quality, well oriented epitaxial layers of high temperature superconductors can be grown by a variety of techniques and on a variety of substrates, so that well characterized junctions can be made in several ways.

STATEMENT OF THE PROBLEM

The ceramic nature of the oxide superconductors has so far been an obstacle to their introduction into a wide variety of devices and circuits. Because they are so different from the materials most commonly used in today's electronics, it is not possible to use well known processing sequences to make devices and circuits from them. Conversely, the processing conditions necessary for the perovskite superconductors destroy many materials commonly used for electronics applications, including some of the noble metals used for contacts.

For the successful application of the high temperature superconductors in superconducting electronic devices, then, it is necessary to develop an appropriate manufacturing technology. This includes not only processing techniques to shape the superconductors, but also the choice of materials to be used in the devices and circuits. Several dielectric materials are now known to be compatible with the cuprate superconductors, but conductors have so far eluded researchers. While it is tempting to use noble metals and hope for the best, these materials are not truly compatible with ceramic processing. A good metal that is not degraded in a high temperature oxidizing atmosphere is needed for making superconducting devices and circuits that require resistive elements or non-superconducting conductive elements.

Multi-layers are vital for many applications of high temperature superconductors. In fact, for growth of thin films on any but a few lattice-matched and chemically compatible substrates like $LaAlO_3$ and $NdGaO_3$, even the growth of a single layer of oxide superconductor requires the deposition of at least two layers of material. If a device requires two or more superconducting layers, these must be separated by a dielectric, or insulating, layer. The result is a multi-layered heterostructure in which several epitaxial layers are deposited and patterned, and then more layers of material are deposited on top of the pattern. Heterostructures such as these are at risk of degrading unless close lattice match is maintained between all of the individual layers, and unless the stress due to thermal expansion mismatch is minimized. All of the layers must also be stable under the conditions used for deposition of superconducting, insulating, and metallic materials.

The metals currently in use in HTS technology must be deposited in the final step, since they melt or react when heated in oxygen to the temperatures necessary for growth of HTS crystals. This precludes their use as buried resistors in integrated circuits and so requires redesign of the circuits and their fabrication sequences. When metals are used as part of a junction, the junction must be placed carefully so that it can be processed in the final step.

One of the basic elements of superconductor electronic devices is the Josephson junction. While the first intimations of Josephson behavior in the oxide superconductors are beginning to appear in the literature, the first reported intentionally fabricated junctions were of the weak-link type. They are characterized by a critical current density $J_c$, a critical current $I_c$, an effective device cross-sectional area A, the resistance of the normal region $R_n$, and normalized junction resistance $R_nA$. To make good electronic devices and circuits from the oxide superconductors, a manufacturable junction technology must be developed.

A manufacturable technology is one that gives reproducible and predictable results when a defined series of processing steps is carried out. The devices perform as designed, and the processes are robust, that is, are not rendered ineffective by small changes in processing parameters. A particular requirement of the technology is that all necessary processing steps should be compatible, so that one step does not destroy the results of a step that must be performed earlier in the flow.

The junctions formed by this technology should meet design criteria as specified by the user. The junctions must perform reliably at a specified temperature. They must carry a current density of 100 to 100,000 A/cm$^2$, at the designer's discretion, and must do so for the foreseeable lifetime of the device. Fluctuations in the critical current of each junction, as well as variations from junction to junction in a circuit, must be minimized. Noise must be reduced to a level at which random signals due to noise are much smaller and less common than the true signals the circuit is designed to detect.

So far, all of the weak-link junction technologies have been dominated by the properties of the interfaces that form the electrical junction. This means that a given junction design will have junction parameters, like $J_c$, that fall into a certain range most of the time. Controlling the actual value within this range, however, has not been possible until now. The choice of ideal critical current density for a junction depends on the application of the junction in an integrated superconducting circuit, and digital devices have different requirements than analog devices.

For useful superconducting quantum interference devices (SQUIDs) it is necessary to fabricate matched pairs of junctions in a predetermined geometrical relationship. Not only must each junction have predictable qualities, but they must be easy to position at will. In practical terms this implies that all of the materials used in a circuit should be patterned using similar techniques.

DISCUSSION OF THE PRIOR ART

The need for a reproducible junction technology has been recognized by the research community. Because of the small coherence length in the oxide superconductors, virtually any deviation from perfection can interrupt the flow of supercurrent enough to form a junction. Now that crystal growth technology has progressed to the current state in which high-quality, well oriented epitaxial layers of high temperature superconductors can be grown by a variety of techniques and on a variety of substrates, well characterized junctions have been made in several ways.

Various prior art junctions 20 are shown schematically in FIGS. 1a–1f. The step junction, schematically depicted in FIG. 1 a, is fabricated by forming a step in the substrate 10 (and buffer layer, if applicable) and then depositing a layer of superconductor over the step. The superconducting film is well oriented over both planar regions of substrate, but between them over the step is a region of disrupted epitaxy bounded on each side by an artificially induced grain boundary. The superconductor film is thick enough to completely cover the step. A step and gap junction, FIG. 1b, is formed by a similar technique except that the superconductor film is not continuous across the step. Instead, a gap is formed and a normal metal is used to make contact between the two superconducting regions.

Fabricated grain boundary junctions can be reproducibly made by two techniques. In the bi-crystal technique, FIG. 1c, a single crystal substrate 10 is cut into two (or more) pieces along a given crystallographic direction. One piece is trimmed to present an edge with a different crystallographic direction, which would normally meet the first at an angle Θ. This edge is then polished and the two pieces are bonded back together so that an artificial grain boundary is formed. A superconducting film grown on top of this substrate will reproduce the grain boundary, forming a weak-link junction. Another technique for forming a grain boundary junction is to use a seed layer 100 as shown in FIG. 1d and as described in U.S. Pat. No. 5,157,466, which has at least one common inventor with this application and which is assigned to the same entity. This seed layer 100 is a material on which the superconductor material of choice grows epitaxially, but with a different crystallographic orientation than on the material under the seed layer. It is deposited over a substrate 10 (and buffer layers, if desired) and then patterned by photolithography and wet or dry etching. The superconducting layer grown on top of this structure will grow with two distinct crystallographic orientations depending on whether the seed layer has been removed or not, and grain boundary junctions will form at the edge of the seed layer, defining the border between any two regions.

An edge junction is shown in FIG. 1e. As in the step and gap junction, the superconducting layer is discontinuous, and contact is made either through a normal metal (SNS) or across an insulator (SIS). Here a superconducting layer 12 is deposited on a substrate 10, and a protective layer 14 is deposited over it. The composite is patterned and a layer of normal racial or insulator 16 is deposited over the patterned layers. A second superconducting layer 18 is deposited over this non-superconducting layer. Finally, the entire structure is patterned, completing the device. In an alternative fabrication technique, the first superconductor layer and the protective layer are patterned and then subjected to a process which degrades superconductivity along the edge. This process may be plasma ashing, ion beam damaging, or anything that results in a reduced $T_c$ or $I_c$. The second layer of superconductor can then be deposited without an intervening insulator or normal metal.

The trilayer junction is shown schematically in FIG. 1f. A superconducting layer 12 having either a-axis or c-axis orientation is deposited on a substrate 10. A layer of insulator or normal metal 16 is deposited over the superconductor. A second layer of superconductor 18 is then deposited on top of the non-superconductor 16, and a junction 20 is formed. As for the edge junction, the non-superconducting layer may actually be a layer of degraded superconductor.

Superconducting-normal-superconducting (SNS) type devices using $YBa_2Cu_3O_{7-\delta}$ have been investigated by several groups. Noble metals such as Au, Ag, and their alloys have been used as the normal material in the microbridge, or step and gap, geometry (FIG. 1b). Trilayer (FIG. 1f) and edge junction (FIG. 1e) geometries require barrier materials that grow epitaxially on $YBa_2Cu_3O_{7-\delta}$ and which can be epitaxially grown on it. To date $PrBa_2Cu_3O_7$, $Y_xPr_{1-x}Ba_2Cu_3O_7$, normal $YBa_2Cu_3O_{7-\delta}$, and $SrTi_{1-x}Nb_xO_3$ have been used as the normal barrier layer materials in epitaxial SNS type structures. (Alloys may be denoted $A_{1-x}B_x$ where it is understood that $0 \leq x \leq 1$, that is, the range of composition extends from pure B to pure A.) None of these materials has formed a truly reproducible, manufacturable junction with the desired characteristics.

The noble metals, Au, Ag, and their alloys, have so far been used as the normal metals in SNS junctions as well as contact materials for perovskite superconductors. These materials are very good metals, but are incompatible with perovskite superconductor multi-layer processing. Because they melt at relatively low temperatures, they cannot be heated up to the normal deposition temperatures for oxide superconductors. Thus, these materials would have to be deposited last, and further superconducting layers could not be added. Even if such degradation were not a problem, epitaxial growth of cuprate superconductors is not possible on these noble metals, and again further superconducting layers could not be added. Furthermore, some researchers have found that Au and Ag substitute for the Cu in the cuprate superconductors, degrading the superconductors in the process;

The non-superconducting perovskites, on the other hand, are compatible with oxide superconductor processing, but they are rather poor metals. Both $PrBa_2Cu_3O_7$ and Y-doped, or alloyed, $PrBa_2Cu_3O_7$ ($Y_xPr_{1-x}Ba_2Cu_3O_7$) are very anisotropic layered structures which form irregular grain boundaries at their top and bottom surfaces. These materials contain many stacking faults, second phases, and other defects which appear in transmission electron microscopy (TEM) to pervade the material. An additional complication presented by the anisotropy of these materials is the presence of conduction paths in the c-direction which may be needed to traverse the barrier. Finally, because their electrical properties depend strongly on composition, different groups have reported superconducting, insulating, and metallic behavior of films having the same nominal compositions.

One of the distinct advantages of perovskite metallic oxides which are the subject of this invention is their cubic, or at least largely isotropic, crystal structure. Isotropic materials are not subject to the uncertainty associated with the crystallographic orientation of defects which plagues the layered Pr oxides. Because the conductivity, for example, is equal in all directions in a cubic material, the elongation of a void along a particular crystallographic axis has no more or less impact than would its elongation along any other direction in the crystal. Thus sensitivity to a preferred orientation among film defects is reduced with isotropic perovskite metallic oxides when compared to materials of lower symmetry.

$SrTi_{1-x}Nb_xO_3$ is difficult or impossible to dope to metallic conductivity without removing oxygen because any extra charges introduced by the Nb are compensated by Sr vacancies. It has been reported that some Nb can be diffused into single crystal $SrTiO_3$. Such an extra diffusion process, which must involve interstitial defects, is not easily controllable. Furthermore, it degrades the surface upon which the second (upper) superconductor layer must be epitaxially grown. One report in the literature that $SrTi_{1-x}Nb_xO_3$ was used to fabricate an SNS junction has not been duplicated by us, or others. It was most likely due to shorts between the two superconducting layers.

A good barrier layer material for epitaxial SNS structures must satisfy several requirements. First, it must be an electrically conducting material. Ideally its metallic conductivity should not depend strongly on doping, stoichiometry, or oxygen concentration. For this reason, among others, the semiconducting oxides and normal (degraded) $YBa_2Cu_3O_{7-\delta}$ are not the best choice for the normal material. Second, the barrier material should be very nearly lattice matched with the $YBa_2Cu_3O_{7-\delta}$ to reduce strain at the interfaces and the consequent increased defect density. The barrier's thermal expansion coefficient, should closely match that of the superconductor to be used to avoid the introduction of strain during thermal cycling from growth and processing temperatures to operation temperatures and back to room temperature. The electrical conductivity and density of states in energy of the barrier material should be comparable to that of the superconductor (in its normal state) in order to minimize discontinuities in the magnitude of the superconducting order parameter at the interfaces. Finally, its deposition conditions must be compatible with those used for deposition of high temperature superconductors. The metallic properties of the barrier material should not be compromised by exposure to an oxidizing atmosphere at high temperature, nor by heating under high vacuum conditions. The barrier material should not undergo chemical reactions with any other material it may be in contact with, e.g., substrate, buffer, or superconductor, during processing or operation. The barrier material must form a continuous film to avoid unintentional shorts between superconducting layers. The materials currently in use fail in one or more of these respects.

Similar criteria influence the choice of materials for use as metals in other areas of a superconducting integrated circuit. Metals for resistors, contacts, bonding pads, and normal interconnects must first of all be good metals. Clearly, failed superconductors will not be useful here. In addition, a predictable resistivity at the anticipated operation temperature is necessary. Furthermore, the precision required for resistor metals would tend to rule out materials whose conductivity depends sensitively on processing. For buffed layers, good crystallinity is necessary for the subsequent deposition of epitaxial superconducting layers. Until now, no candidate materials have met all of these requirements.

OBJECTS OF THE INVENTION

It is therefore the primary object of this invention to provide a material for use as a normal metal at any point in a perovskite superconductor-based integrated circuit. The material must be truly metallic, having a resistivity which is not a strong function of temperature and typically decreases approximately linearly with temperature. The material must be stable under the conditions of temperature, pressure, and gas mixture composition typically encountered in the crystal growth and processing of oxide superconductor materials. The material must be capable of epitaxial growth on HTS-compatible substrates, buffer layers, and HTS materials themselves, and it must present a suitable effective substrate for subsequent growth of high-quality epitaxial layers of HTS materials.

It is a further object of the present invention to provide an improved weak-link junction in high temperature superconducting materials which has a controllable critical current density and low noise. This is accomplished by fabricating superconductor-normal-superconductor (SNS) junctions using a metallic oxide as the normal material. The metallic oxide is a true metal, yet it is completely compatible with oxide superconductor processing. Furthermore, the critical current density of the junction can be controlled by the choice of the thickness of the normal layer. The critical current density of the junction varies exponentially with barrier thickness even though there is a finite interface resistance. This control is not available in most of the other technologies, either because the thickness of the barrier is fixed, as for grain boundary junctions, or because it has no direct effect on the critical current density of the junction.

It is a further object of the present invention to provide a superconductor-normal-superconductor junction having very low lattice strain and negligible interface resistance. This is accomplished by fabricating an SNS junction using a layered perovskite, usually an alloy of a superconducting cuprate as the barrier layer.

It is yet another object of the invention to provide an improved junction having low lattice strain, a negligible interface resistance, a relatively high normal state resistance and a simple geometry. This may be accomplished using a layered perovskite in a tri-layered SNS junction geometry.

It is yet another object of the invention to provide a material which may be used as a resistive element in an all-oxide integrated circuit. Such a material should be compatible with the ceramic processing used for the other elements of the circuit while maintaining its metallic behavior. The integrated circuit may include resistors, capacitors, inductors, transistors, or any other desirable electronic device, and it may include conductors, insulators, superconductors, and ferroelectric materials in any combination that will produce the desired effect of the circuit.

SUMMARY OF THE INVENTION

The heart of the present invention, then, is the use of a truly metallic oxide material as the "N" or "normal" material in a high temperature superconductor SNS junction, or at any other point in an oxide superconductor-based integrated circuit where a non-superconducting metal is desired. A metallic oxide is a metal oxide, that is, a chemical compound of at least one metal and oxygen, which exhibits metallic behavior. Metal oxides can be either dielectrics or metallic oxides, depending on the magnitude and temperature dependence of their resistivities. Dielectric metal oxides, for instance, are not suitable for this application.

A metallic oxide is a true metal in the sense that its resistance is not much affected by doping with impurities or by changes in its oxygen content during superconductor processing. Because it is an oxide, it is not degraded by the processing environment necessary for the formation of high-quality epitaxial layers of oxide superconductors. Since it can be grown epitaxially on the same substrates as the oxide superconductors, as well as on these superconductors themselves, it can form an appropriate intermediate layer for subsequent deposition of further layers of perovskite superconductors.

Some layered perovskites produce even lower interface resistances when used as barrier layers in SNS junctions. These layered perovskites, usually alloys of superconducting cuprates such as LaSrCuO and YBCO, have lattice constants and thermal expansion coefficients that more closely match those of the superconducting layers in the SNS structures.

ADVANTAGES OF THE INVENTION

The particular use of a metallic oxide in high temperature superconductor-based, integrated circuits confers the following advantages. This material is a true metal, not an insulator nor a semiconductor nor a failed superconductor. Its resistivity is not a strong function of temperature, and typically varies linearly with temperature. It is not significantly affected by the addition of impurities, "doping," or by the oxidizing atmosphere necessary for the production of high temperature superconductors in thin film form. This constancy of properties is important for the reproducibility and reliability of circuit elements which make use of the metal.

A metallic oxide is a stable oxide. It is compatible with the ceramic processing steps used in fabrication of oxide superconductor structures. Unlike elemental metals and their alloys, it is not degraded at elevated temperatures in an oxygen atmosphere. Unlike the non-superconducting layered perovskite compounds, it is a good metal.

This material forms in the pseudocubic perovskite crystal structure. It is therefore suitable as an intermediate layer in perovskite superconductor heterostructures. It can be grown epitaxially on the same class of substrates that are already used for high-temperature superconductor crystal growth. Layered perovskite superconductors grow epitaxially on the metallic oxides with orientation either in the a- or c-direction. In both cases; the normal (a- or c-) direction is determined entirely by factors under the control of the crystal grower.

This material has lattice constants which are very similar to the a and b lattice constants of the superconducting perovskites. Its thermal expansion coefficients are also very similar to those of the superconducting perovskites. This compatibility results in much lower stress on the films during thermal cycling than is experienced with elemental metals and their alloys. Lower residual stress in thin films results in fewer dislocations and other defects. Since these defects can alter the electrical properties of the films as well as compromise their structural integrity, the lower stress films exhibit more desirable electrical and microwave properties.

The material's isotropic nature is an advantage for both circuit design and device performance. While it may be slightly non-cubic, it has an electrical conductivity in all directions that is comparable to the normal state conductivity of $YBa_2Cu_3O_{7-\delta}$ in the a-b plane. This isotropy reduces the chaotic effect of localized defects and microstructure, because the location or crystallographic orientation of the defect will not greatly affect the average conductivity. This behavior is in contrast to that of the highly anisotropic Pr oxide materials, in which a defect along the high-conductivity direction will have a much greater effect than one oriented along the c-axis.

Further objects and advantages of the invention will become apparent from the following discussion of the preferred embodiments, with reference to the accompanying drawings.

BRIEF DESCRIPTION OF THE DRAWINGS

FIGS. 1a–1f shows schematically several types of prior art weak-link junctions fabricated in high temperature superconductors. FIG. 1a shows a step junction, FIG. 1b a step and gap junction, FIG. 1c a bi-crystal junction, FIG. 1d a bi-epitaxial junction, FIG. 1e an edge junction, and FIG. 1f a trilayer junction.

FIG. 2 is a schematic cross-section of the structure of a preferred embodiment of the invention.

FIG. 3 shows the resistivity of the metallic oxide $CaRuO_3$ as a function of temperature.

FIG. 4a shows the I-V data at 4.2K over the 5-mV range near 0 V. FIG. 4b shows the I-V data at 77K over the 0.2-mV range near 0 V. FIG. 4c is a composite of data taken at both temperatures from −100 mV to about 120 mV.

FIG. 5 shows the variation of the critical current density with the thickness of the metallic oxide barrier layer.

FIG. 6a is a schematic view of the physical layout of the SQUID. FIG. 6b shows the modulation of the SQUID voltage in response to an applied magnetic field.

DESCRIPTION OF THE PREFERRED EMBODIMENTS

Figure 4C:
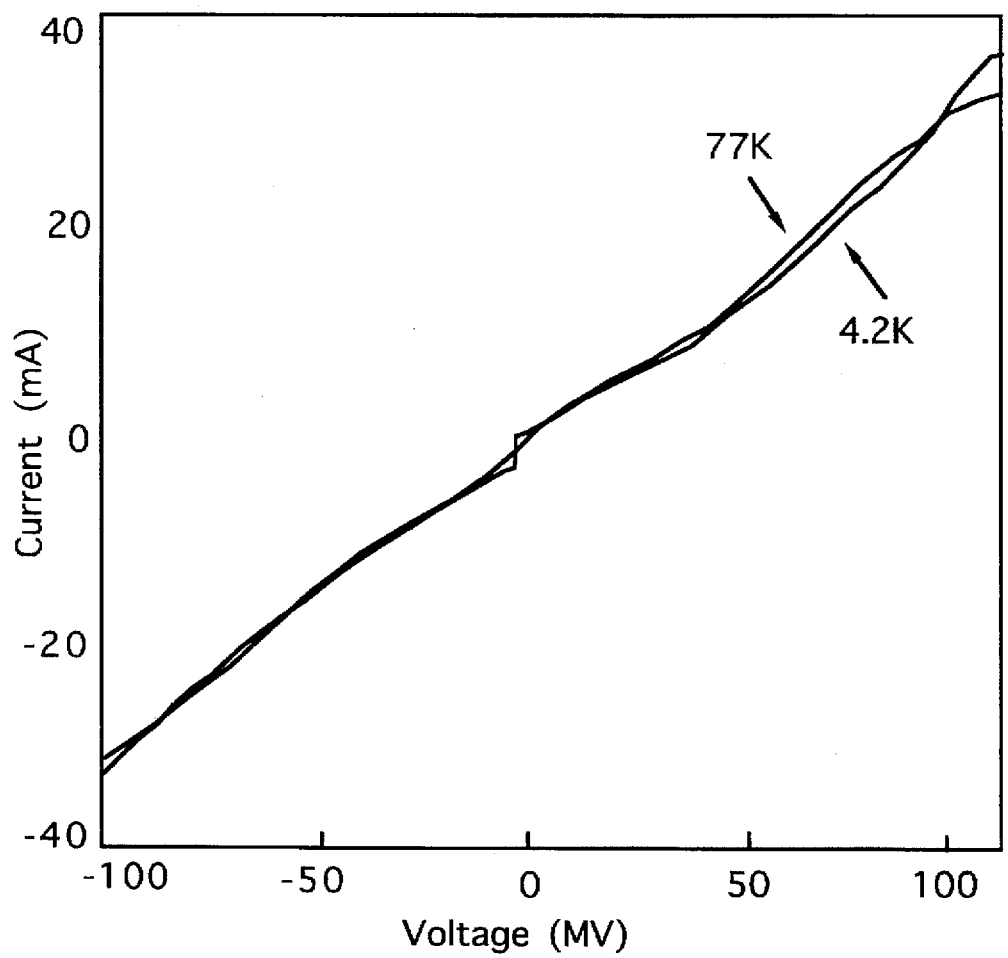
FIGS. 4a–4c show the current-voltage characteristics of the junction according to the present invention.

A schematic side view of one preferred embodiment of the invention is shown in FIG. 2. A first superconducting layer 12 of $YBa_2Cu_3O_{7-\delta}$, about 200 nm in this case, is deposited on a crystalline substrate, in this case, a (001) $LaAlO_3$ substrate 10. An insulator 14, in this case, 300 nm of epitaxial $SrTiO_3$, is deposited on top of this superconducting layer 12 to prevent contact between the first superconducting layer 12 and either the normal layer 16 or the second superconducting layer 18. The first superconducting layer 12 and the overlying insulator 14 are patterned as desired. A layer of metallic oxide 16, here 10 to 50 nm of epitaxial $CaRuO_3$, covers the entire surface, making contact with the substrate 10 in region 1, the edge of the first superconducting layer 12, the edge of the insulator 14, and the top of the insulator 14. Finally the second superconducting layer 18, typically about 200 nm of $YBa_2Cu_3O_{7-\delta}$, is deposited over the entire surface, making direct contact only with the metallic oxide 16, and forming the junction 20. The top surface and underlying layers may be patterned as desired. Further layers may also be added at this time.

The junction according to this invention may also be fabricated in a trilayer geometry. Referring to FIG. 1f, a first layer of superconductor 12 overlies a substrate 10. A layer of metallic oxide 16 separates this first superconducting layer 12 from the second superconducting layer 18. The junction 20 is formed between the first superconducting layer 12 and the second superconducting layer 18. This structure can, of course, be patterned as desired.

Trilayer junctions fabricated using a layered oxide material as the barrier offer several potential advantages over other high-$T_c$ junction configurations. Because the epitaxial layers needed to produce this type of junction can be deposited sequentially in-situ and no additional processing is required to form the junction interfaces themselves, the interfaces in such a device are expected to be quite clean and coherent with very little lattice strain and negligible interface resistance. In addition, the geometry of such a device is much more well-defined than is the case for edge junctions, and therefore the current and field distributions governing its, operation are more straightforward and easy to predict. A further very important advantage of the c-axis trilayer junctions which has not been exploited to date is that the c-axis resistivity of the perovskite superconductors is known to be far greater than the a-axis or b-axis resistivity, and therefore the normal-state resistance, $R_n$, and hence the $I_cR_n$ product of these devices can be much larger than for other junction structures.

There are a number of conducting oxides with a perovskite structure, including $CaMoO_3$; $LaTiO_3$, $SrRuO_3$, $SrCrO_3$, $SrIrO_3$, and their mixed metal alloy oxides such as $La_{0.5}Sr_{0.5}CoO_3$. In fact, any $AMO_3$ metallic oxide which forms in the perovskite crystal structure may be used when A is a rare or alkaline earth element and M is any transition metal. A can also be replaced by $A'_{1-x}A''_x$ where A' is a rare or alkaline earth element and A" is a different rare or alkaline earth element. Rare earth elements include Y and the lanthanide series, having atomic numbers 57 through 71. Alkaline earth elements include elements in Group IIA, having atomic numbers 4 (Be), 12 (Mg), 20 (Ca), 38 (Sr), 56 (Ba), and 88 (Ra). The transition metals are elements in Groups IB, IIB, IIIA through VII. A, and VIII. The transition metals have atomic numbers 21 through 30, 39 through 48, 57 through 80, and 89 through 112. Not all of these elements have been prepared.

The lattice constants in the $(Sr_{1-x}Ca_x)RuO_3$ system, where $0 \leq x \leq 1$, have been determined by X-ray $\Theta$-$2\Theta$ scans to range from 3.96 Å for $SrRuO_3$ to 3.86 Å for $CaRuO_3$ when these materials are grown epitaxially on $LaAlO_3$ substrates. The expanded c-axis lattice constants imply that the films are under mild compression on $LaAlO_3$ substrates. Several of these alloy compositions have been used as the barrier material in SNS junctions on test samples, and so far the best results have been obtained by using $CaRuO_3$. This material has a very close lattice match to $YBa_2Cu_3O_{7-\delta}$, which can be improved by alloying with $SrRuO_3$. The Ca-rich compositions of the alloy undergo no ferromagnetic transition above the anticipated operating temperature of the junction, as do the Sr-rich compositions.

In addition to the simple pseudocubic perovskites, some layered perovskites also form barriers with very low interface resistance. In fact, interface resistances of the order of $10^{-10}$ $\Omega cm^2$ have been observed in $YBa_2Cu_3O_{7-\delta}$/barrier/$YBa_2Cu_3O_{7-\delta}$ when the barrier material is $Y_{0.5}Ca_{0.5}Ba_2Cu_3O_{7-\delta}$, $YBa_2Cu_{2.79}Co_{0.21}O_{7-\delta}$, or $La_{1.4}Sr_{0.6}CuO_4$.

Lattice constants and thermal expansion coefficients are given for several of these materials in the following table.

| Material | Lattice constant | Thermal expansion coefficient |
| --- | --- | --- |
| $YBa_2Cu_3O_{7-\delta}$ | 0.382–0.389 nm (a,b) <br> 1.17 nm (c) | $8$–$10 \cdot 10^{-6}$/K (a,b) <br> $17$–$20 \cdot 10^{-6}$/K (c) |
| $LaAlO_3$ | 0.379 nm | $10 \cdot 10^{-6}$/K |
| $SrTiO_3$ | 0.390 nm | $10 \cdot 10^{-6}$/K |
| $CaRuO_3$ | 0.385–0.386 nm | $^{-6}$/K |
| $La_{0.5}Sr_{0.5}CoO_3$ | 0.383–0.384 nm | $10 \cdot 10^{-6}$/K |
| $Y_{0.5}Ca_{0.5}Ba_2Cu_3O_{7-\delta}$ | 0.382–0.389 nm (a,b) <br> 1.17 nm (c) | $8$–$10 \cdot 10^{-6}$/K (a,b) <br> $17$–$20 \cdot 10^{-6}$/K (c) |
| $YBa_2Cu_{2.79}Co_{0.21}O_{7-\delta}$ | 0.382–0.389 nm (a,b) <br> 1.17 nm (c) | $8$–$10 \cdot 10^{-6}$/K (a,b) <br> $17$–$20 \cdot 10^{-6}$/K (c) |
| $La_{1.4}Sr_{0.6}CuO_4$ | 0.39 nm (a) <br> 1.33 nm (c) | $10 \cdot 10^{-6}$/K (a,b) <br> $17$–$20 \cdot 10^{-6}$/K (c) |

OPERATIONAL DESCRIPTION $CaRuO_3$ appears to be a well behaved metallic oxide when it is deposited as an epitaxial film under conditions similar to those used for $YBa_2Cu_3O_{7-\delta}$. FIG. 3 shows the resistivity of an epitaxial $CaRuO_3$ film on a $LaAlO_3$ substrate as a function of temperature. Its resistivity, about 600 $\mu\Omega cm$ at room temperature, decreases as the temperature decreases, implying metallic behavior. The curvature of the resistivity vs. temperature trace deviates from the traditional Bloch-Gruneissen formula for metals, and there is a large amount of residual resistivity at low temperature.

The geometry of one of the SNS edge junctions we fabricated and tested is shown schematically in FIG. 2. In order to establish the quality of the patterned edge of the first superconducting layer 12, an identical junction structure was fabricated without the metallic oxide barrier layer 16. The critical current density of the resulting $YBa_2Cu_3O_{7-\delta}$/$YBa_2Cu_3O_{7-\delta}$ junction 20 was greater than $10^6$ A/cm$^2$ at 77K. This implies that most of the ion beam damage done to the edge of the first superconducting layer 12 during the initial patterning is annealed out when the $YBa_2Cu_3O_{7-\delta}$ is heated again in 100 mTorr of oxygen for the subsequent deposition.

Figure 4A:
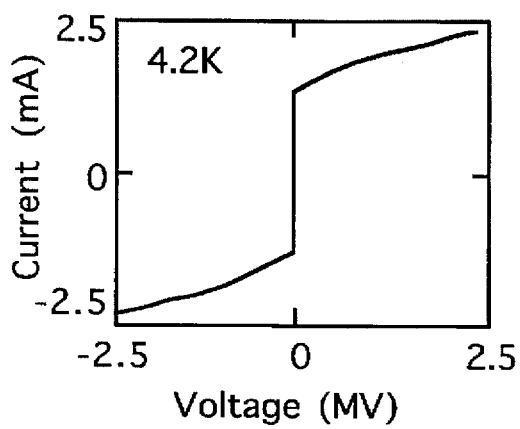
Figure 4B:
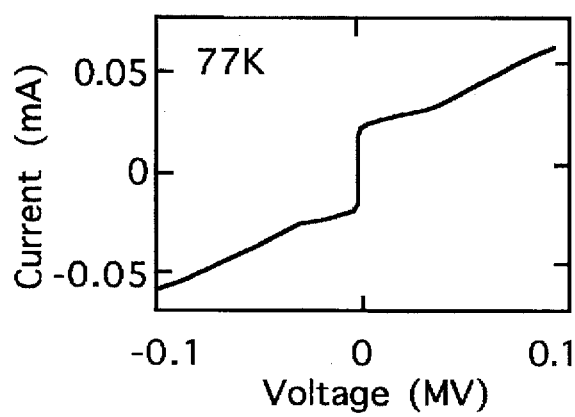

The current-voltage characteristics of a junction with a 30-nm $CaRuO_3$ barrier are shown in FIG. 4. At 4.2K (FIG. 4a) the 10 $\mu m$-wide junction shows slightly hysteretic behavior with a 1.3 mA critical current. As the current increases, the characteristic bends slightly toward a lower dynamic conductance state at a voltage of about a millivolt, and bends back to a higher conductance state at a few tens of millivolts; see FIG. 4c. This increasing conductance was observed for all the junctions with barrier thicknesses from 10 to 50 nm. While the junction resistance is predominantly that of the interface, the origin of the non-linearity is not clear. As the temperature is increased, the bend in the current-voltage characteristic decreases, as seen in FIGS. 4b and 4c. The critical current of the $YBa_2Cu_3O_{7-\delta}$ current leads is exceeded at 77K with a bias of 30 mA, resulting in the bending toward a higher resistance state at that bias.

The effect of the metallic oxide barrier thickness on critical current density is shown in FIG. 5. At 4.2K these results exhibit a large scatter at each thickness, but the critical current density can be fitted with an exponential relation $$J_c(d) = J_{co} \exp(-d/4.1 \text{ nm})$$

suggesting a normal coherence length of 4.1 nm for $CaRuO_3$ at 4.2K. This relationship provides evidence that the critical current density of this SNS junction can be controlled by choosing the thickness of the normal material. This control is an important advantage of the invention.

Trilayer structures of $YBa_2Cu_3O_{7-\delta}$/$CaRuO_3$/$YBa_2Cu_3O_{7-\delta}$ were fabricated with both c-axis and a-axis $YBa_2Cu_3O_{7-\delta}$. Regardless of the orientation of the $YBa_2Cu_3O_{7-\delta}$, the junction resistances were of the same order as those with the edge geometry. The ability to grow high quality oxide superconductors on top of the metallic oxides is another important advantage of the present invention. It is not possible to grow good epitaxial layers of high temperature. superconductors on top of the noble metals.

C-axis-oriented tri-layers using $YBa_2(Cu_{1-y}Co_y)_3O_{7-\delta}$ as the barrier and $YBa_2Cu_3O_{7-\delta}$ for the top and bottom layers were fabricated. The cobalt percentage in the barrier layer was varied from 6.7% (y=0.067) to 14% (y=0.14), and the thickness of the barrier layer was varied from 50 nm to 160 nm. These structures were patterned into junctions with cross-sectional areas of $10 \times 10$ $\mu m^2$ to $40 \times 40$ $\mu m^2$.

Figure 6A:
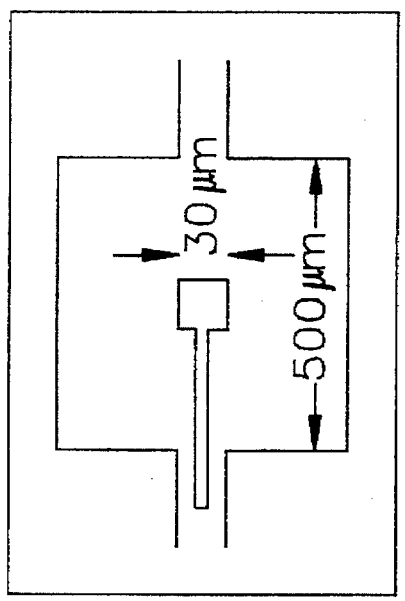
FIGS. 6a and 6b show the behavior of a SQUID made with the SNS junction of the present invention.
Figure 6B:
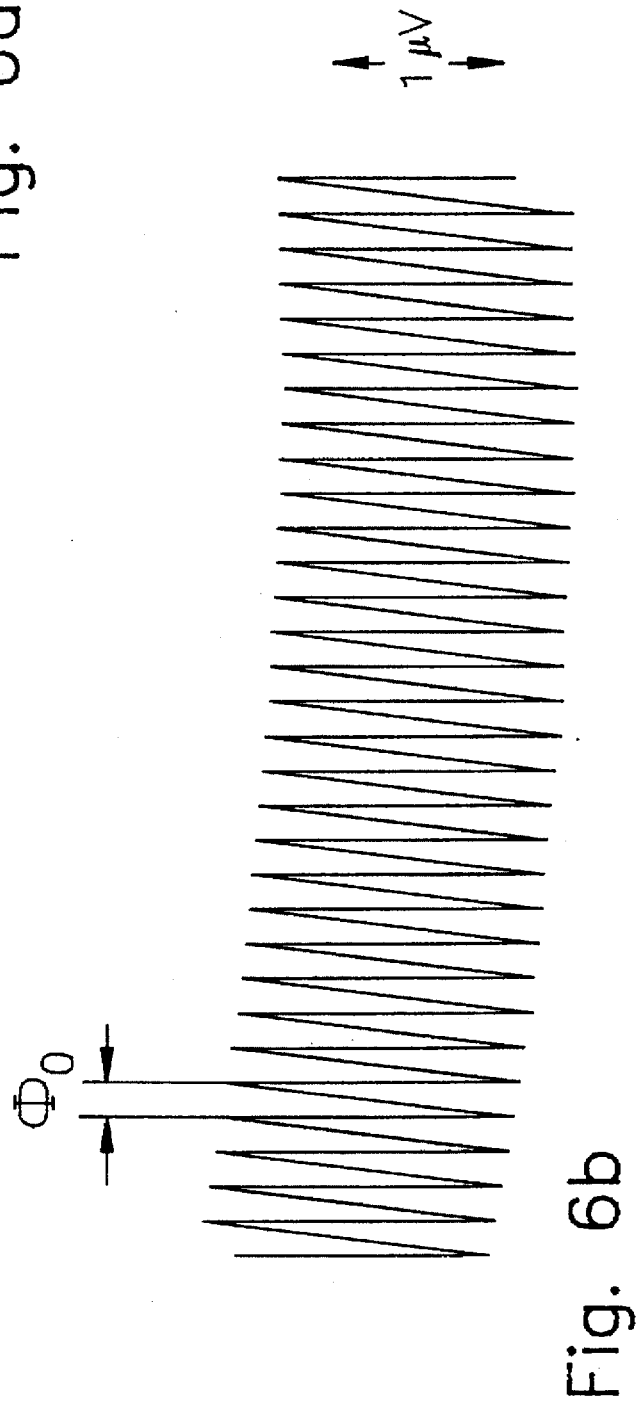

Shapiro steps are constant-voltage current jumps which appear on the current-voltage characteristic as a result of the phase locking of applied microwave radiation with the Josephson oscillations of the junction current and voltage. The variation of the height of these steps with microwave power provides a useful verification of the Josephson effect. Shapiro steps were observed in these structures, as was critical current modulation as a function of microwave field strength. Modulation of critical current in a magnetic field perpendicular to the substrate shows complicated behavior due to the particular geometry of edge junctions. A dc SQUID was fabricated with $YBa_2Cu_3O_{7-\delta}$/20-nm $CaRuO_3$/$YBa_2Cu_3O_{7-\delta}$ junctions. The planar geometry of the device is shown schematically in FIG. 6a. Its inductance was approximately 200 pH. At 77K the SQUID had a critical current of 600 $\mu A$ and a resistance of 0.1 $\Omega$. The SQUID showed voltage modulation by magnetic field and its calculated effective area of 16,000 $\mu m^2$ agreed well with its geometry.

Figure 7:
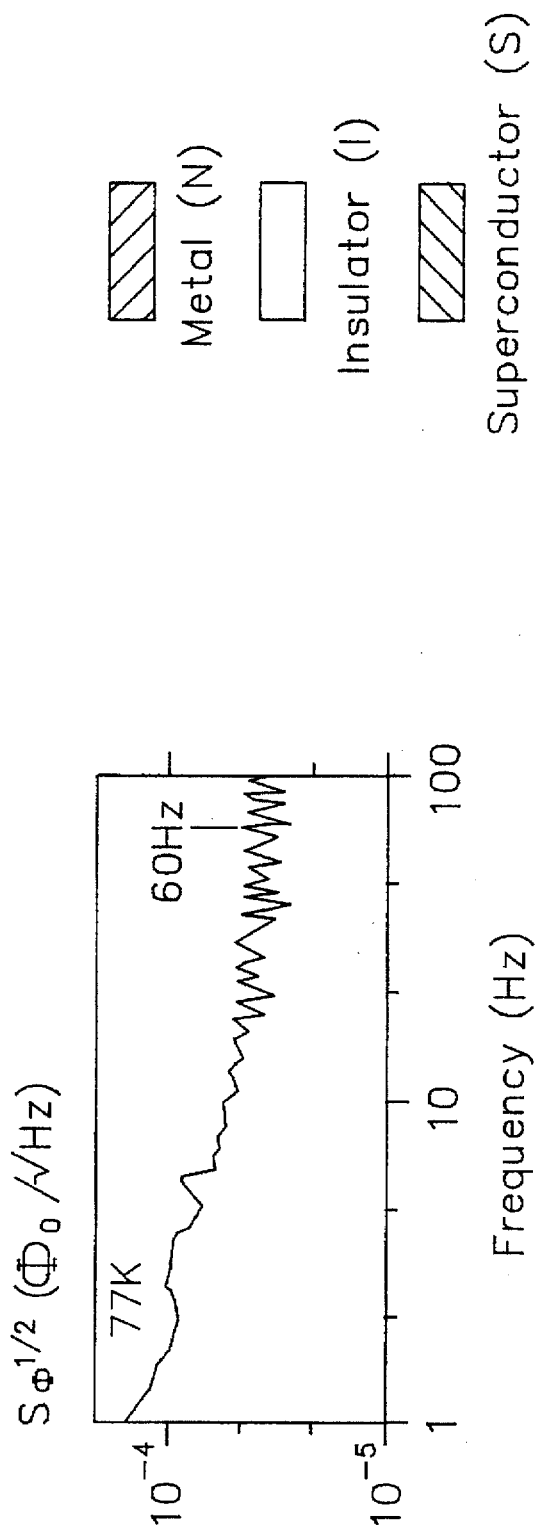
FIG. 7 shows the behavior of the flux noise of the SQUID of FIG. 6 as a function of its frequency of operation.

The noise of this SQUID is shown in FIG. 7. The transition from white noise to 1/f noise occurs at 1.5 Hz with a knee value of about 70 $\mu\Phi_0$. The white noise value is approximately 35 $\mu\Phi_0$. The spike in the data occurs at 60 Hz and is an artifact of the measurement.

Figure 14A:
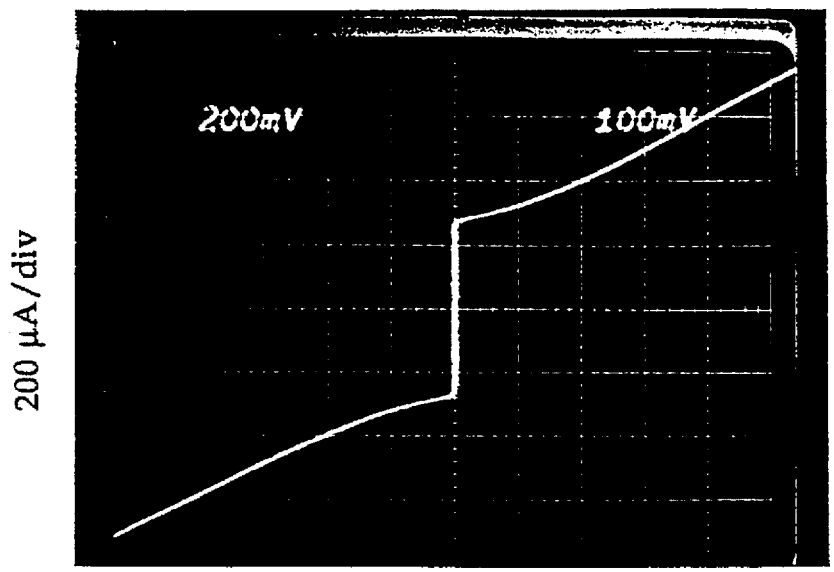
FIG. 14a shows the current-voltage characteristic (IVC) at 34K of a 10×10 µm² c-axis trilayer junction with a 160 nm thick $YBa_2Cu_{2.7}Co_{0.3}O_{7-\delta}$ barrier.
Figure 14B:
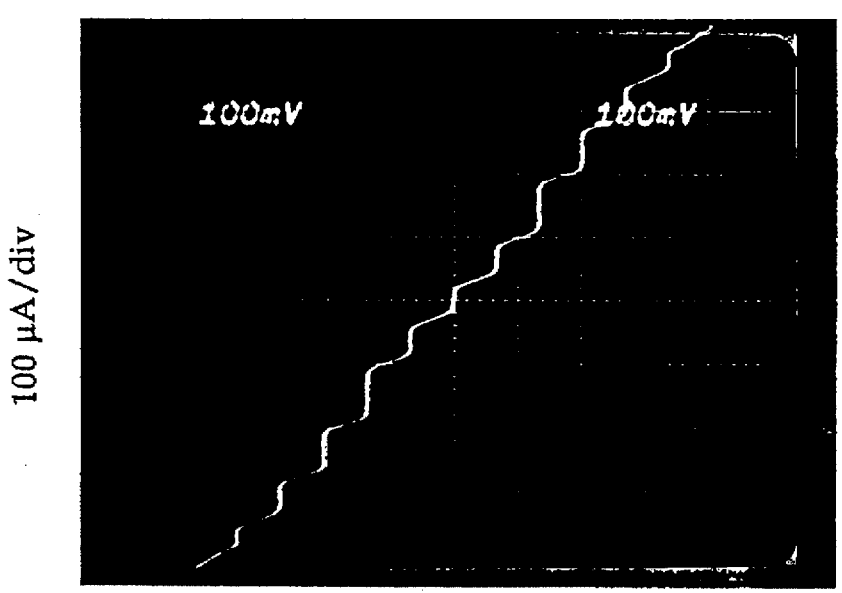
FIG. 14b shows the Shapiro step response of this junction in the presence of applied microwave radiation.
Figure 15A:
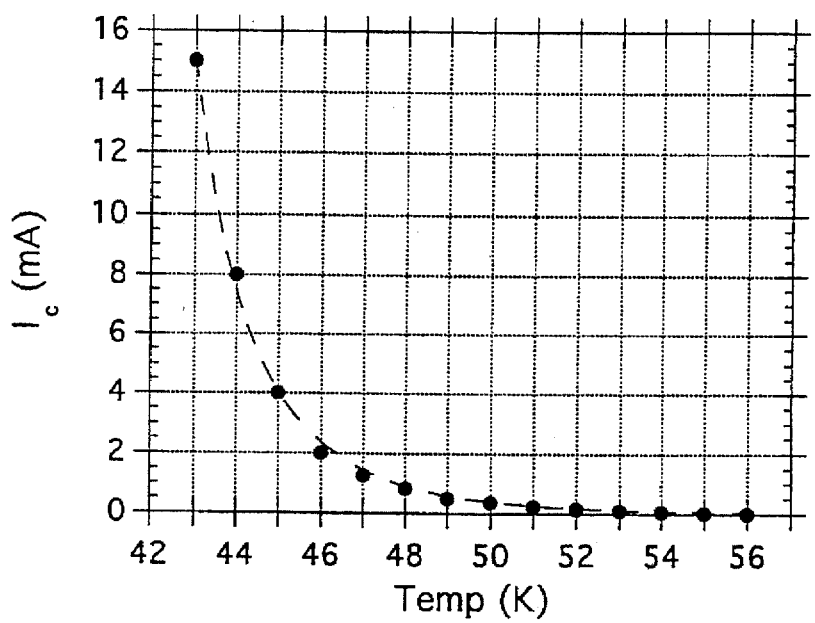
FIG. 15a shows the temperature dependence of the critical current $I_c$ for a 20×20 µm² c-axis trilayer junction with a 160 nm thick $YBa_2Cu_{2.8}Co_{0.2}O_{7-\delta}$ barrier.
Figure 15B:
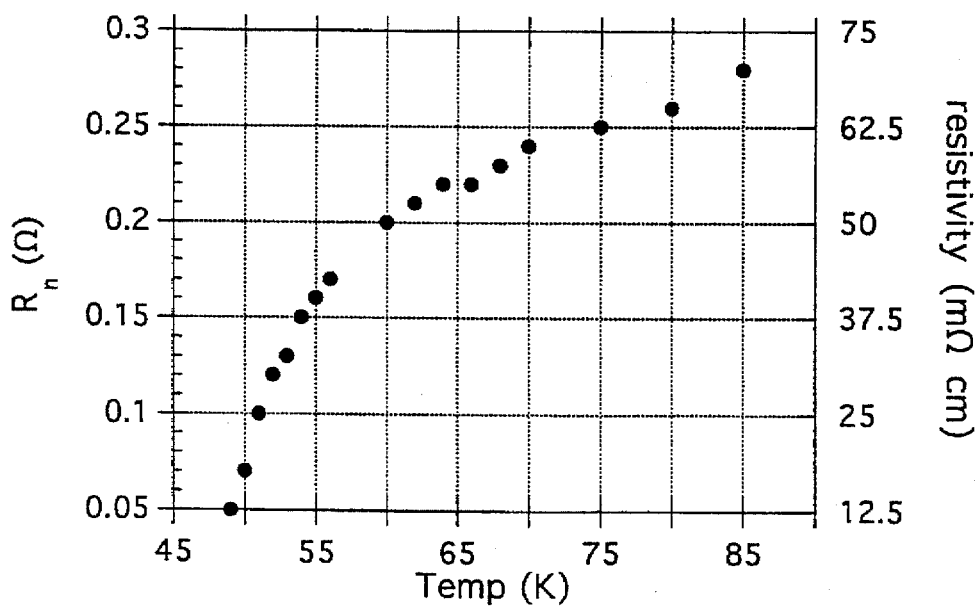
FIG. 15b shows the temperature dependence of the normal-state resistance $R_n$ for this same device.

The current-voltage characteristic of a trilayer junction with a 160 nm thick $YBa_2Cu_{2.7}Co_{0.3}O_{7-\delta}$ barrier is shown in FIG. 14a at 34K. This device demonstrates the clear appearance of Shapiro steps with application of microwave radiation, as shown in FIG. 14b. The critical current of these junctions also modulates in the presence of an applied magnetic field. The temperature dependence of the critical current of a similar c-axis device with a $YBa_2Cu_{2.8}Co_{0.2}O_{7-\delta}$ barrier is shown in FIG. 15a. The data may be fit quite well by the de Gennes proximity theory of SNS junctions (dashed line), yielding a coherence length of ≈10 nm. The normal-state resistance $R_n$ of this device may be extracted from the linear portion of the IVC, and this quantity is plotted as a function of temperature in FIG. 15b. Note that the corresponding resistivity $\rho_n$ is quite large, with a value of 50 mΩ cm at 60K. If the cross-sectional area of this device were reduced to 1×1 μm², the devices would have a resistance of $R_n$=80 Ω at 60K, a quite high number, indeed. Also note that the resistance experiences a sharp drop for temperatures below about 60K, corresponding to the appearance of the Josephson supercurrent, as in FIG. 15a. This drop in $R_n$ is most likely associated with an aspect of the proximity-coupled behavior of these devices, and is a further indication that they are functioning as expected.

Figure 8:
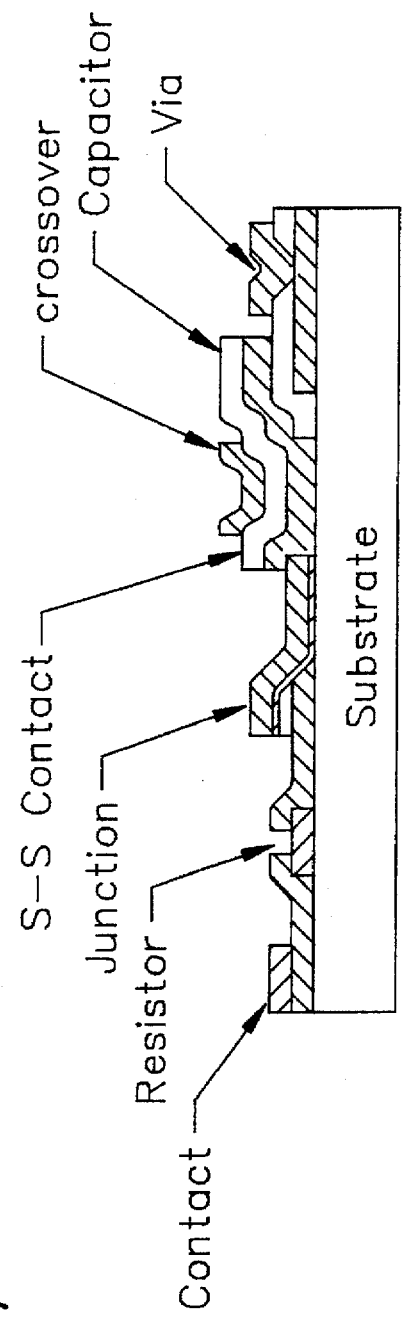
FIG. 8 is a schematic partial side view of a superconductor-based integrated circuit using a metallic oxide as the normal material.

FIG. 8 shows a schematic cross-section of part of an integrated circuit combining oxide superconductor, insulating, and normal metal layers. The structure includes many layers, and at least one superconducting layer is grown on top of the metallic oxide layer. This schematic representation is meant to indicate the great utility of the metallic oxides as disclosed here.

Process Description

The use of a conducting oxide material as the normal layer 16 in an SNS junction (see FIG. 2) allows the entire structure to be manufactured using similar processes. The first superconducting layer 12 is deposited on a suitable substrate 10 by an appropriate deposition technique; The resulting superconductor must be epitaxial with the substrate, that is, it must have its major crystallographic axes aligned with those of the substrate in a predetermined orientation. It must be substantially free of high-angle grain boundaries, that is, grain boundaries between 5° and 85°; twinning and low-angle grain boundaries are acceptable. The superconductor must have a high superconducting transition temperature (>23K) and high critical current density (>$10^5$ A/cm²) at the anticipated operating temperature. Several well known techniques may be used to deposit such a superconducting layer. These include, but are not limited to, laser ablation or pulsed laser deposition, off-axis or on-axis sputtering, electron beam evaporation, and metal-organic chemical vapor deposition (MOCVD). Although it is not the recommended method, it is also possible to make the film 12 by an ex siva process.

The following is given by way of example of a manufacturing process for forming the edge junction structure described above. Those skilled in the art of oxidide superconductor fabrication will no doubt be able to devise variations in this process, and alternatives to it. This description is intended to be an example only.

A suitable crystalline substrate 10 for the structure is selected; for the purposes of illustration (001) $LaAlO_3$ has been chosen, As used herein, the term crystalline substrate refers to a support material having major crystallographic axes and having a lattice structure suitable for the growth of a superconducting oxide. A first superconducting layer 12 of $YBa_2Cu_3O_{7-\delta}$, about 200 nm in this case, is deposited on the substrate. Normal deposition conditions for these materials, when deposited by laser ablation, are: substrate temperatures about 780° C.±20° C., oxygen pressure 400–550 mT, laser energy about 2–5 J/cm² at the target. More detailed process conditions for epitaxial film growth are described in many publications.

Next an insulator 14, in this case 300 nm of epitaxial $SrTiO_3$, is deposited to prevent contact between the first superconducting layer 12 and either the normal layer 16 or the second superconducting layer 18. The first superconducting layer 12 and the overlying insulator 14 are patterned as desired. For the devices whose test results are shown patterning was accomplished with standard photolithography followed by $Ar^+$ ion beam milling. Then a layer of metallic oxide 16 is deposited over the entire surface, making contact with the substrate 10 in region 1, the edge of the first superconducting layer 12, the edge of the insulator 14, and the top of the insulator 14. Finally the second superconducting layer 18 is deposited over the entire surface, making contact only with the insulator 16, and forming the junction 20. The top surface and underlying layers may be patterned as desired. Our structures were again patterned using $Ar^+$ ion beam milling to leave the structure depicted in FIG. 2. Further layers may also be added at this time. Contacts to the first layer of superconductor 12 is made by selectively removing part of the insulator 14 to form windows through which metal (typically Au or Ag) contacts are deposited by a suitable method.

The first superconductor layer 12 may be any of the high-temperature (oxide, perovskite) superconductors having a superconducting transition temperature greater than about 23K. This includes, but is not limited to, $YBa_2Cu_3O_{7-\delta}$, $BiSrCuCaO$, $TlBa_2Cu_3O_{7-\delta}$ and $RBa_2Cu_3O_{7-\delta}$, where R is any rare earth element except Tb, Pr, or Ce.

The substrate 10 may in fact be a substrate covered by one or several layers of buffering material. Many buffer layers are now known to be suitable for epitaxial growth of perovskite superconductors on substrates that might otherwise be unsuitable because of lattice constant mismatch, a large difference in thermal expansion coefficient between the substrate and the superconductor, or potential chemical reaction between the substrate and the superconductor either at room temperature or at the elevated temperatures used in processing. Appropriate buffer materials include, but are not limited to, $CaTiO_3$, $SrTiO_3$, MgO, $CeO_2$, $PrBa_2Cu_3O_{7-\delta}$, $LaAlO_3$, $SrAlTaO_3$, and $NdGaO_3$. Suitable substrates include, but are not limited to, $CaTiO_3$, $SrTiO_3$, MgO, $Al_2O_3$, $LaAlO_3$, $SrAlTaO_3$, and $NdGaO_3$. The number of individual layers or materials in the substrate 10 does not constitute an important part of the invention, and for the purposes of this disclosure "substrate" is taken to include any and all layers below the first superconducting layer 12.

The insulator 14 may be deposited in the same deposition run as the first superconducting layer 12 by the same technique, or the sample may be removed from the growth apparatus and the insulator 14 deposited by the same or different technique in a separate deposition sequence. The purpose of the insulator 14 is to electrically isolate the first superconducting layer 12 from the metallic oxide 16 except in the region of the junction 20. To perform this function it must be electrically insulating in the frequency range and at the temperature at which the junction is anticipated to operate. Suitable materials include, but are not limited to, $CaTiO_3$, $SrTiO_3$, MgO, $CeO_2$, $LaAlO_3$, $Sr_2AlTaO_6$, and $NdGaO_3$. These materials may again be deposited by any desired method that is capable of producing thin films with the desired properties. Although this layer may even be amorphous for some structures and applications, when it forms the effective substrate for the deposition of the metallic oxide layer 16 or subsequent epitaxial layers, it must be of sufficiently high crystallinity that an epitaxial layer can be grown on top of it.

The insulator 14 may in fact be composed of several layers of one or more materials when the entire structure functions as an insulator. For example, in order to reduce pinholes it is sometimes convenient to deposit a thin layer of $SrTiO_3$, remove it from the growth apparatus, clean it to remove any surface particles, and then return it to the growth apparatus and deposit another layer of $SrTiO_3$. In another case, a single layer of $SrTiO_3$ may be used as the primary insulator while a layer of $PrBa_2Cu_3O_{7-\delta}$ is deposited on top to serve as a better template for subsequent growth of the metallic oxide 16. The number of individual layers or materials in the insulator structure 14 does not constitute an important part of the invention, and for the purposes of this disclosure "insulator structure" is taken to include any and all layers between the first superconducting layer 12 and the metallic oxide layer 16.

After the deposition of the insulator 14, the superconducting 12 and insulating 14 layers are selectively removed to form a desired pattern. The pattern may be transferred first to photoresist using well known photolithographic techniques. After the pattern is formed in the resist it is transferred to the sample by wet etching, dry etching, or a combination of the two. Any technique for selectively removing the insulator 14 and superconductor 12 may be used, provided that the remaining surfaces (after the remaining photoresist is stripped) provide good templates for the subsequent deposition of an epitaxial layer of metallic oxide 16. An alternative, method for forming the desired pattern is to use a shadow mask during deposition of the first superconducting 12 and insulating 14 layers. This shadow mask inhibits deposition of material in undesired regions by interposing itself between the deposition source and the intended substrate.

The metallic oxide lager 16 is deposited on the patterned sample. It may be deposited by any technique that results in the formation of an epitaxial layer of metallic oxide in the region of the junction 20. These methods are mentioned above. Because this layer forms the effective substrate for the deposition of the second superconducting layer 18, it must be of sufficiently high crystallinity that an epitaxial layer of perovskite superconductor can be grown on top of it in. the region of the junction 20. Suitable materials for this barrier layer include a number of conducting oxides with a perovskite structure, including $CaMoO_3$, $LaTiO_3$, $SrRuO_3$, $SrCrO_3$, $SrIrO_3$, and their mixed metal alloy oxides, such as $La_{0.5}Sr_{0.5}CoO_3$. In fact, any $AMO_3$ metallic oxide which forms in the perovskite crystal structure may be used when A is a rare or alkaline earth element and M is any transition metal. A can also be replaced by $A_{1-x}A'_x$ where A is a rare or alkaline earth element and A' is a different rare or alkaline earth element. Rare earth element include Y and the lanthanide series, having atomic numbers 57 through 71. Alkaline earth elements include elements in Group IIA, having atomic numbers 4 (Be), 12 (Mg), 20 (Ca), 38 (Sr), 56 (Ba), and 88 (Ra). The transition metals are elements in Groups IB, IIB, IIIA through VIIA and VIII. The transition metals have atomic numbers 21 through 30, 39 through 48, 57 through 80, and 89 through 112. Not all of these elements have been prepared.

Substituted layered perovskites may also be used. Some of these have the general formula $(A_{1-x}A'_x)_m(M_{1-y}M'_y)_n O_{2m+n}$, where $0 \leq x$, $y \leq 1$ and $0.5 \leq m$, $n \leq 3$, A and A' are alkaline earth elements, alloys of alkaline earth elements, rare earth elements, alloys of rare earth elements, or alloys of alkaline earth and rare earth elements, and where M and M' are transition metal elements or alloys of transition metal elements. Others have the general formula $(A_{1-x}A'_x)A'''_2 (M_{1-y}M'_y)_3O_{7-\delta}$, where $0 \leq x \leq 1$ and $0 \leq y \leq 1$, A is a rare earth element (Y and the lanthanide series, atomic numbers 57 through 71), where A' and A''' are alkaline earth elements, alloys of alkaline earth elements, rare earth elements, alloys of rare earth elements, or alloys of alkaline earth and rare earth elements, and where M and M' are transition metal elements or alloys of transition metal elements.

OTHER EMBODIMENTS

Figure 9A:
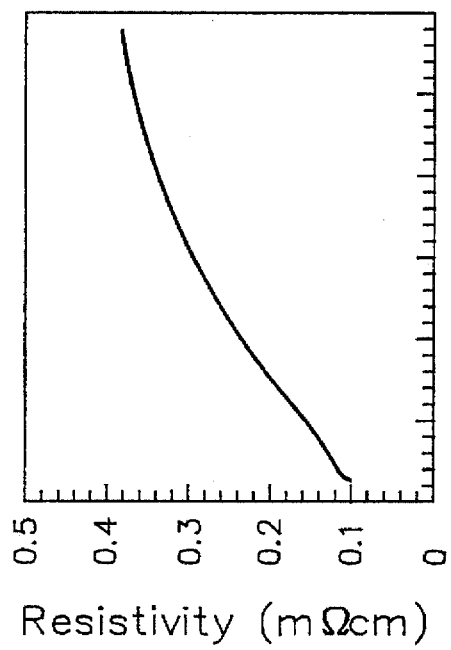
FIG. 9a shows the temperature dependence of the $CaRuO_3$ resistivity, $\rho(T)$.
Figure 9B:
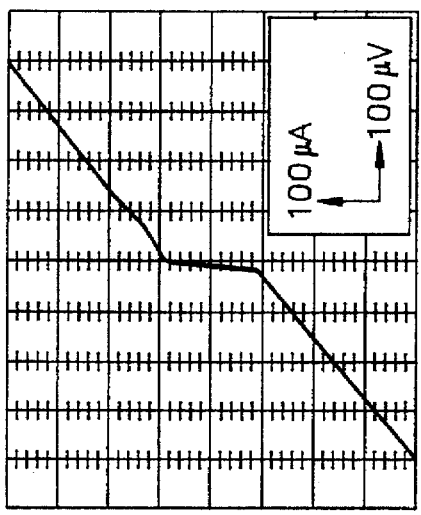
FIG. 9b shows the current-voltage characteristics (IVC) of a junction with a 10-nm thick $CaRuO_3$ barrier at 77K.

FIG. 9a shows the temperature dependence of the $CaRuO_3$ resistivity, $\rho(T)$. FIG. 9b shows the current-voltage characteristics (IVC) of a junction with a 10-nm thick $CaRuO_3$ barrier at 77K. The majority of the junction resistance here comes from the interface between YBCO and the barrier, since the resistance of the barter layer itself is only about 25 m$\Omega$ (=200 $\Omega$cm·$10^{-6}$ cm/(0.2 μm·4 μm)), which is about two orders of magnitude smaller than $R_n$.

Figure 10A:
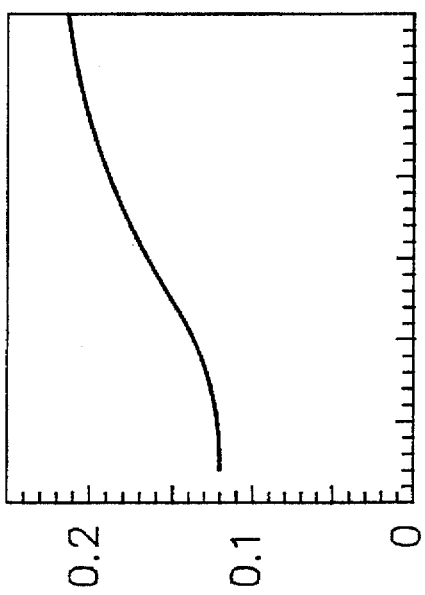
FIG. 10a shows the temperature dependence of the $La_{0.5}Sr_{0.5}CoO_3$ resistivity, $\rho(T)$.
Figure 10B:
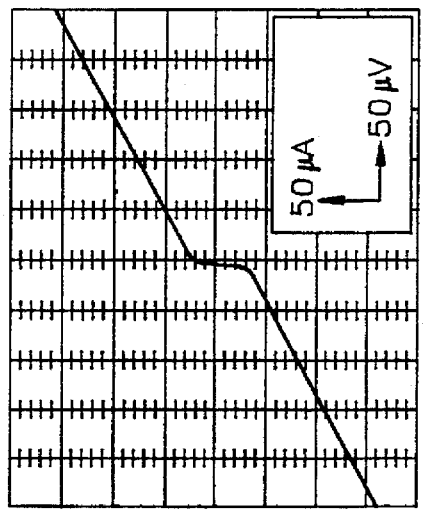
FIG. 10b shows the current-voltage characteristics (INC) of a junction with a 10-nm thick $La_{0.5}Sr_{0.5}CoO_3$ barrier at 47.5K.

A similar barrier material, $La_{0.5}Sr_{0.5}CoO_3$, also with a cubic perovskite structure, has been tried. FIG. 10a shows the temperature dependence of the $La_{0.5}Sr_{0.5}CoO_3$ resistivity, $\rho(T)$. FIG. 10b shows the current-voltage characteristics (IVC) of a junction with a 10-nm thick $La_{0.5}Sr_{0.5}CoO_3$ barrier at 47.5K. The temperature dependence of the resistivity of $La_{0.5}Sr_{0.5}CoO_3$ deviates significantly from that of simple metal, but one can estimate the interface resistance of the junction to be $R_n A = 1.7$ $\Omega \cdot 0.18$ μm$= 1.1 \cdot 10^{-8}$ $\Omega$cm$^2$, where $R_n$ is the resistance of the normal region and A is the device cross-sectional area, which is not much different from that of the $CaRuO_3$ junctions.

Other barrier materials which have a similar layered structure to YBCO have been used to fabricate junctions. One is Ca-doped YBCO and the other is Co-doped YBCO. (In the semiconductor industry, "doping" levels are in the part-per-billion to part-per-trillion range. However, in the oxide superconductors, "doping" can refer to substitution of up to 50% of the species on a given lattice site. Thus "doping" and "alloying" are used interchangeably here.) Ca-doped YBCO is an overdoped version of YBCO with larger carrier density, lower $T_c$ and less anisotropy than YBCO. On the other hand, Co-doped YBCO is an underdoped version of YBCO with smaller carrier density, lower $T_c$ and larger anisotropy. The preferred doping levels for Co-doped YBCO are 2–14%.

Figure 11B:
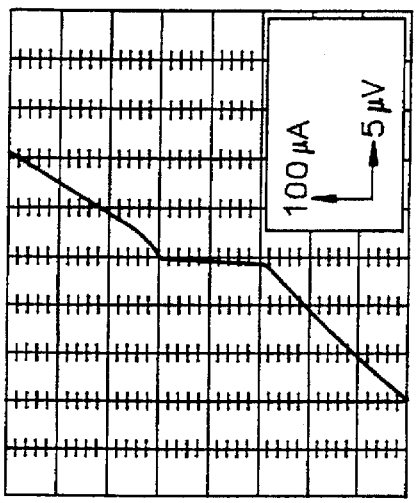
FIG. 11b shows the current-voltage characteristics (INC) of a junction with a 50-nm thick $Y_{0.5}Ca_{0.5}Ba_2Cu_3O_{7-\delta}$ barrier at 82K.
Figure 11A:
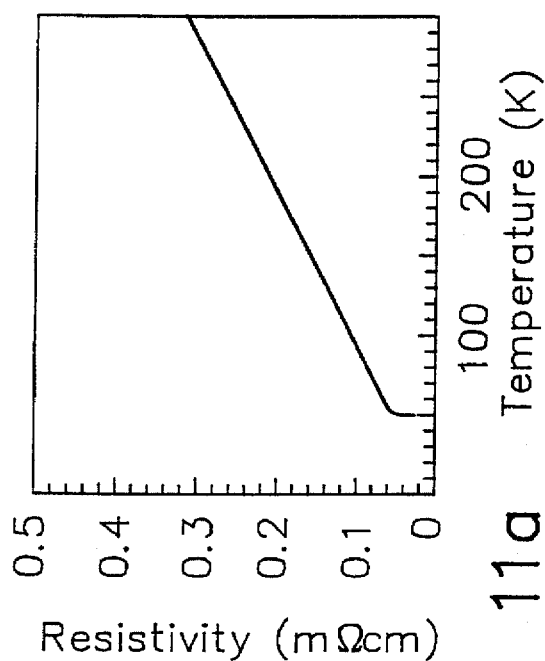
FIG. 11a shows the temperature dependence of the $Y_{0.5}Ca_{0.5}Ba_2Cu_3O_{7-\delta}$ resistivity, $\rho(T)$.

FIG. 11a shows the temperature dependence of the $Y_{0.5}Ca_{0.5}Ba_2Cu_3O_{7-\delta}$ resistivity, $\rho(T)$. FIG. 11b shows the current-voltage characteristics (IVC) of a junction with a 50-nm thick $Y_{0.5}Ca_{0.5}Ba_2Cu_3O_{7-\delta}$ barrier at 82K. The $\rho(T)$ curve of this film shows slightly lower resistivity than YBCO and the onset of superconductivity is around 60K. The measured resistance of the junction, 50 m$\Omega$, is very close to what one expects from the bulk resistivity and dimensions of the barrier, since 70 μ$\Omega$cm·$5 \cdot 10^{-6}$ cm/(0.18 μm·4 μm)=50 m$\Omega$. This is the first example of a barrier material for high $T_c$ SNS junctions which does not have any significant interface resistance. The relatively large barrier thickness of 50 nm also indicates a large normal coherence length in $Y_{0.5}Ca_{0.5}Ba_2Cu_3O_{7-\delta}$.

Figure 12B:
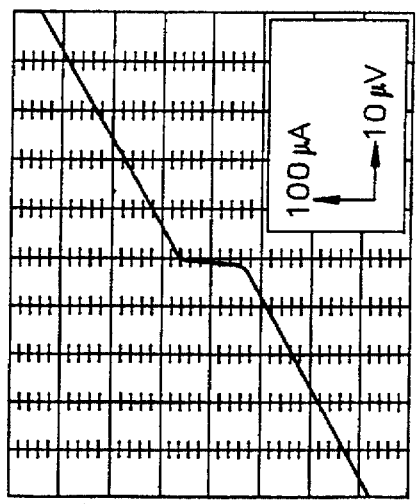
FIG. 12b shows the current-voltage characteristics (IVC) of a junction with a 40-nm thick $YBa_2Cu_{2.79}Co_{0.21}O_{7-\delta}$ barrier at 60K.
Figure 12A:
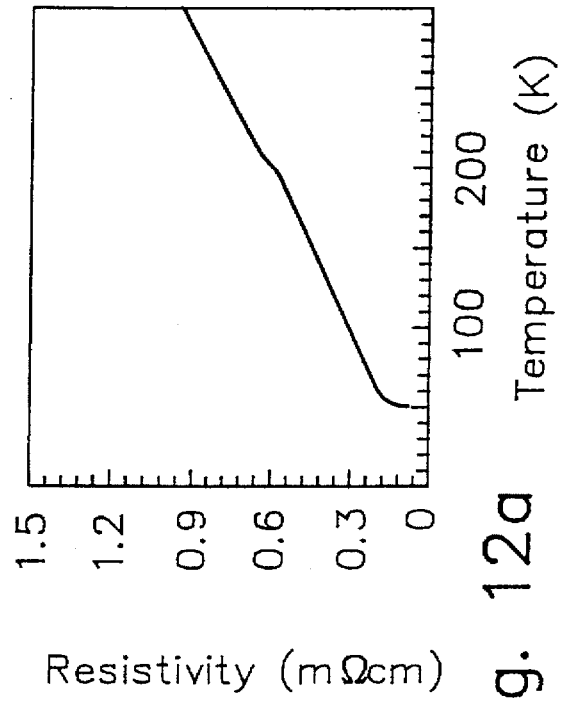
FIG. 12a shows the temperature dependence of the $YBa_2Cu_{2.79}Co_{0.21}O_{7-\delta}$ resistivity, $\rho(T)$.
Figure 16:
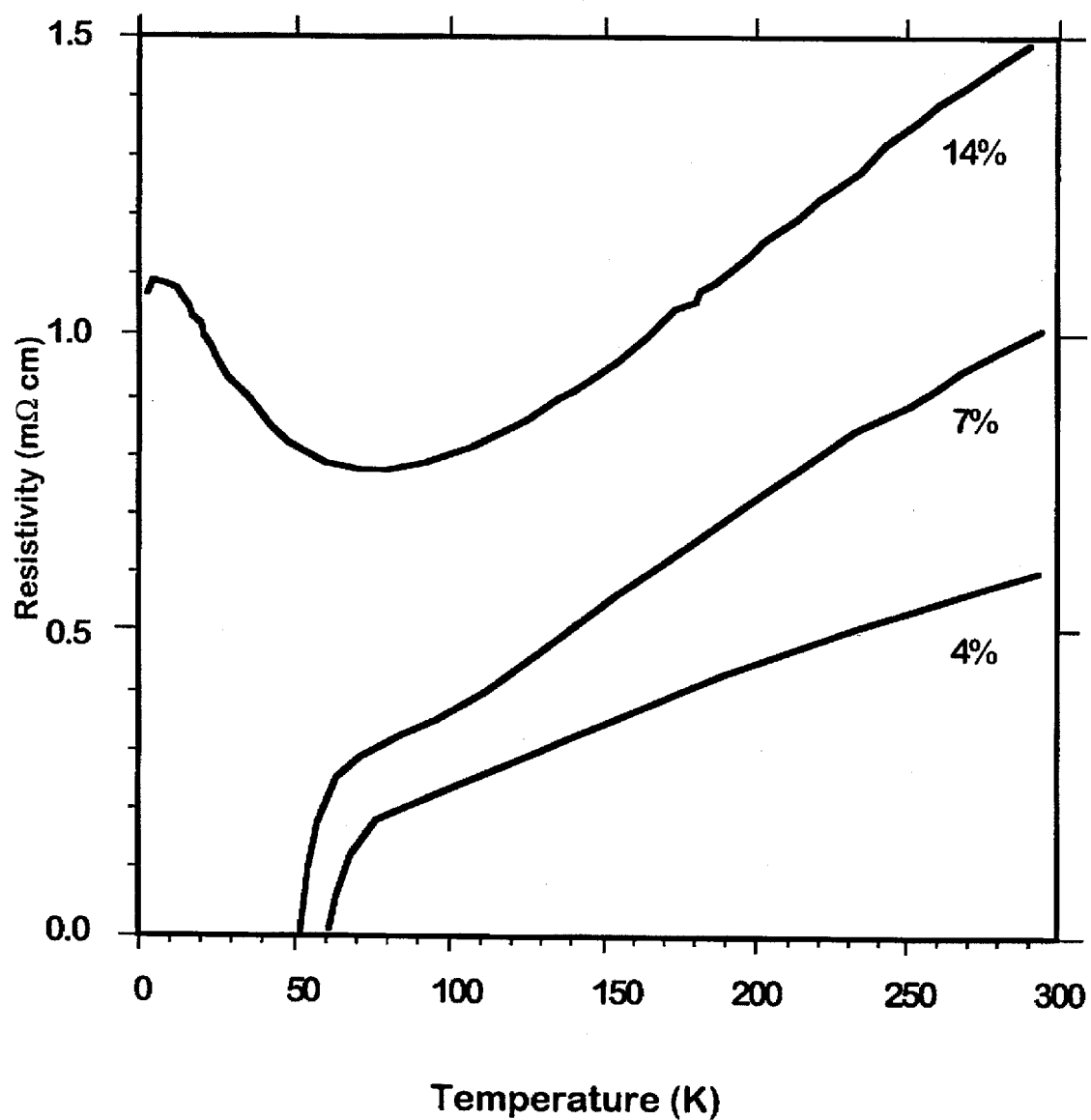
FIG. 16 shows the temperature dependence of the Co-doped YBCO resistivity at doping levels of 4, 7 and 14%.

When YBCO is doped with Co, the Co atoms are known to replace the Cu atoms in the Cu-O chain layers, which in turn depletes the carriers in the YBCO system. The $\rho(T)$ curve of $YBa_2Cu_{2.79}Co_{0.21}O_{7-\delta}$, shown in FIG. 12a, demonstrates the increase of resistivity from reduction of carriers rather than from any increase in scattering, since the resistivity still extrapolates to nearly zero at zero temperature. The onset of superconductivity in the $YBa_2Cu_{2.79}Co_{0.21}O_{7o\delta}$ film is around 50K. The junction with a 40-nm thick $YBa_2Cu_{2.79}Co_{0.21}O_{7-\delta}$ barrier shows $R_n=0.15$ $\Omega$, as shown in FIG. 12b. Again, as in the case of Ca-doped YBCO, the measured resistance of the junction is very close to the expected bulk resistance of the barrier, 0.17 $\Omega$=300 $\mu\Omega$cm·4·10$^{-6}$ cm/(0.18 $\mu$·4 $\mu$m). So this is a second example of an oxide metal which does not have any significant interface resistance when in contact with YBCO. FIG. 16 shows the temperature dependence of the Co-doped YBCO resistivity at doping levels of 4, 7 and 14%.

Figure 13B:
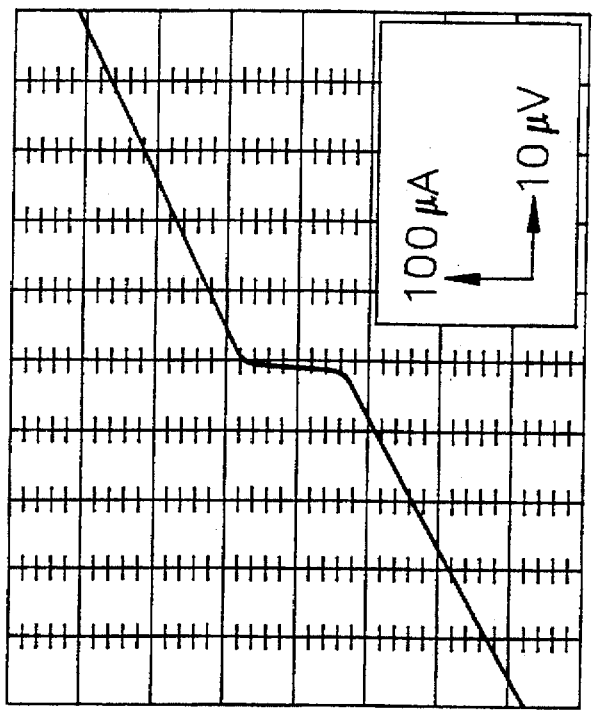
FIG. 13b shows the current-voltage characteristics (INC) of a junction with a 40-nm thick $La_{1.4}Sr_{0.6}CuO_4$ barrier at 54K.
Figure 13A:
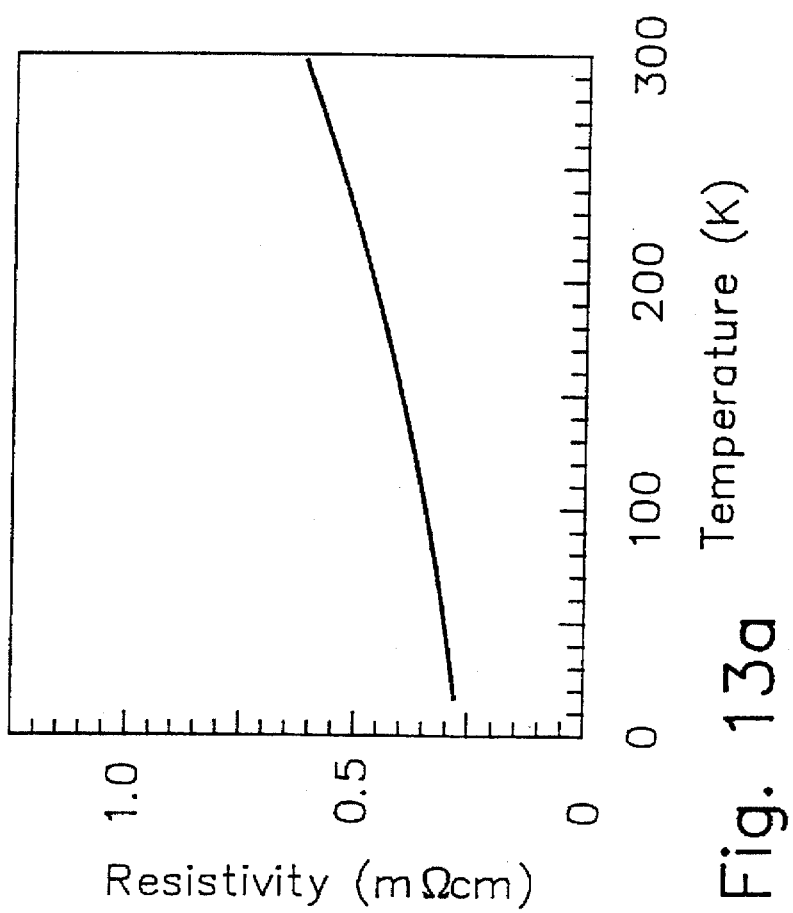
FIG. 13a shows the temperature dependence of the $La_{1.4}Sr_{0.6}CuO_4$ resistivity, $\rho(T)$.

An example of a barrier material that has a good thermal match but a poor lattice match with YBCO in the c-direction is $La_{1.4}Sr_{0.6}CuO_4$. This is an overdoped metallic version of the $La_{2-x}Sr_xCuO_4$ system [8] and its c-axis lattice constant of 1.32 nm is much different from the 1.17 nm of YBCO. Its p(T) curve is shown in FIG. 13a. The estimated bulk resistance of the barrier in the junction of a 40-nm thick barrier, depicted in FIG. 13b, is 300 $\mu\Omega$cm·4·10$^{-6}$ cm/(0.17 $\mu$m·4 $\mu$m)=0.18 $\Omega$. The measured resistance of the junction at 54K is about 0.2 $\Omega$, again suggesting that there is very little interface resistance between YBCO and the $La_{1.4}Sr_{0.6}CuO_4$ barrier.

CONCLUSION, RAMIFICATIONS AND SCOPE

It is therefore apparent that the use of simple or pseudocubic metallic oxides in perovskite superconductor-based devices and integrated circuits confers many advantages over the use of traditional elemental metals and their alloys. The metallic oxides are compatible with the crystal growth and processing of ceramic superconductor materials and do not degrade when subjected to elevated temperatures. The metallic oxides having a simple perovskite crystal structure, which deviates only slightly from cubic symmetry and so from absolute isotropy, may be grown epitaxially on the perovskite superconductors, as well as on substrates and buffer layers onto which the perovskite superconductors can be epitaxially grown. The metallic oxides, in turn, provide suitable templates for the subsequent growth of epitaxial layers of high temperature superconductors and dielectric materials commonly used in devices and circuits based on oxide superconductors.

It is further apparent that certain layered perovskites will find use in these applications.

It should also be apparent to the reader that these simple metallic oxides provide better properties for use in SNS junctions than do degraded superconductor materials. Furthermore, the junctions produced in the SNS geometry using simple metallic oxides exhibit very low noise and controllable critical current densities. The relatively long normal coherence length of the metallic oxides, tens of nanometers, allows one to use reasonable thicknesses of normal material; which is useful for avoiding pinholes and their associated shorts as well as for ease of processing.

Metallic oxides of the type disclosed herein can be used in any device or circuit where it is desirable to have a non-superconducting metal retain its metallic properties during high temperature processing. It might be advantageous for some applications to deposit a layer of metallic oxide on, for example, a sapphire substrate and then to pattern it to form an antenna.

While the foregoing disclosure contains many specificities, it should be understood that these are given by way of example only. The scope of the invention should not be limited by the specific examples given above, but only by the appended claims and their legal equivalents.

What is claimed is:

1. An improved superconductor-normal-superconductor junction, wherein the improvement comprises a normal barrier layer formed from a metallic oxide having a layered perovskite structure selected from the group consisting of $Y_{0.5}Ca_{0.5}Ba_2Cu_3O_{7-\delta}$, $La_{1.4}Sr_{0.6}O_4$ and $YBa_2(Cu_{2.79}Co_{.21})O_{7-\delta}$; wherein $0<\delta\leq0.5$.

2. A Josephson junction device comprising:

a) a crystalline substrate b) a first layer of superconductive oxide on and epitaxial to the substrate, the first superconductive oxide having the chemical formula $YBa_2Cu_3O_{7-\delta}$, wherein $0<\delta\leq0.5$;

c) a second layer of superconductive oxide having the chemical formula $YBa_2Cu_3O_{7-\delta}$, wherein $0<\delta\leq0.5$ d) a barrier layer interposed between the first and second superconductive oxide layers, the barrier layer being formed from a layered perovskite structure selected from the group consisting of $Y_{0.5}Ca_{0.5}Ba_2Cu_3O_{7-\delta}$, $La_{1.4}Sr_{0.6}O_4$ and $YBa_2(Cu_{1-y}Co_y)O_{7-\delta}$; wherein $0.1\leq y\leq0.3$ and $0<\delta\leq0.5$.

3. The junction of claim 2 wherein the barrier layer comprises $YBa_2Cu_{2.79}Co_{0.21}O_{7-\delta}$.

4. The junction of claim 2 wherein y is about 0.12.

5. The junction of claim 2 wherein the barrier layer comprises $Y_{0.5}Ca_{0.5}Ba_2Cu_3O_{7-\delta}$.

6. The junction of claim 2 wherein the first superconductive oxide and the barrier layer are on and epitaxial to the substrate, the first superconductive oxide has an ab plane parallel to the substrate and a c direction perpendicular to the substrate and whereby an edge junction is formed in the ab-plane of the first superconductive oxide.

7. The junction of claim 2 wherein the first superconductive oxide has an ab plane parallel to the substrate and a c direction perpendicular to the substrate, the superconductive oxide is epitaxial to the substrate in the ab plane, the barrier layer is on and epitaxial to the first superconductive oxide and the second superconductive oxide is on and epitaxial to the barrier, whereby a trilayer junction is formed in the c direction of the superconductive oxides.

8. The junction of claim 2, further comprising a $CeO_2$ buffer layer situated between the substrate and the first superconductive layer, wherein the buffer layer is epitaxial to the substrate and to the first superconductive layer.

9. The junction of claim 2, further comprising an insulator of $CeO_2$ situated on the first superconductive layer.

10. The Josephson junction device of claim 2 wherein the barrier layer comprises $YBa_2(Cu_{1-y}Co_y)O_{7-\delta}$; wherein $0.12\leq y\leq0.21$ and $0<\delta\leq0.5$.

11. The Josephson junction device of claim 2 wherein the barrier layer comprises $La_{1.4}Sr_{0.6}O_4$.

* * * * *